(12) United States Patent
Chang et al.

(10) Patent No.: US 7,804,140 B2
(45) Date of Patent: Sep. 28, 2010

(54) FIELD EFFECT TRANSISTOR WITH REDUCED SHALLOW TRENCH ISOLATION INDUCED LEAKAGE CURRENT

(75) Inventors: Leland Chang, New York, NY (US);
Anthony I. Chou, Beacon, NY (US);
Shreesh Narasimha, Beacon, NY (US);
Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 12/041,967

(22) Filed: Mar. 4, 2008

(65) Prior Publication Data

US 2009/0224335 A1    Sep. 10, 2009

(51) Int. Cl.
*H01L 27/088* (2006.01)
(52) U.S. Cl. ............... 257/396; 438/296; 438/595
(58) Field of Classification Search ................ 257/396; 438/296, 595
See application file for complete search history.

(56) References Cited

U.S. PATENT DOCUMENTS

2003/0155613 A1*  8/2003  Hasegawa et al. ........... 257/347
2004/0082133 A1*  4/2004  Salling et al. ............... 438/301
2006/0267096 A1* 11/2006  Maeda et al. ............... 257/347
2009/0050906 A1*  2/2009  Cho et al. .................... 257/84

\* cited by examiner

*Primary Examiner*—Fernando L Toledo
(74) *Attorney, Agent, or Firm*—Scully, Scott, Murphy & Presser, P.C.; H. Daniel Schnurmann

(57) ABSTRACT

Edges of source and drain regions along the direction of a channel of a field effect transistor are formed within an active area offset from the boundary between the active area and a shallow trench isolation structure. Such a structure may be manufactured by forming a gate electrode structure that overlies the boundary so that edges of the source and drain regions are self aligned to the edges of the gate electrode structure on the active area side of the boundary. Unnecessary portions of the gate electrode that does not overlie the source and drain regions may be removed to reduce parasitic capacitance. Shallow trench isolation edge current is eliminated since the semiconductor regions in the current path of the field effect transistor are offset from the boundary between the active area and the shallow trench isolation structure.

17 Claims, 20 Drawing Sheets

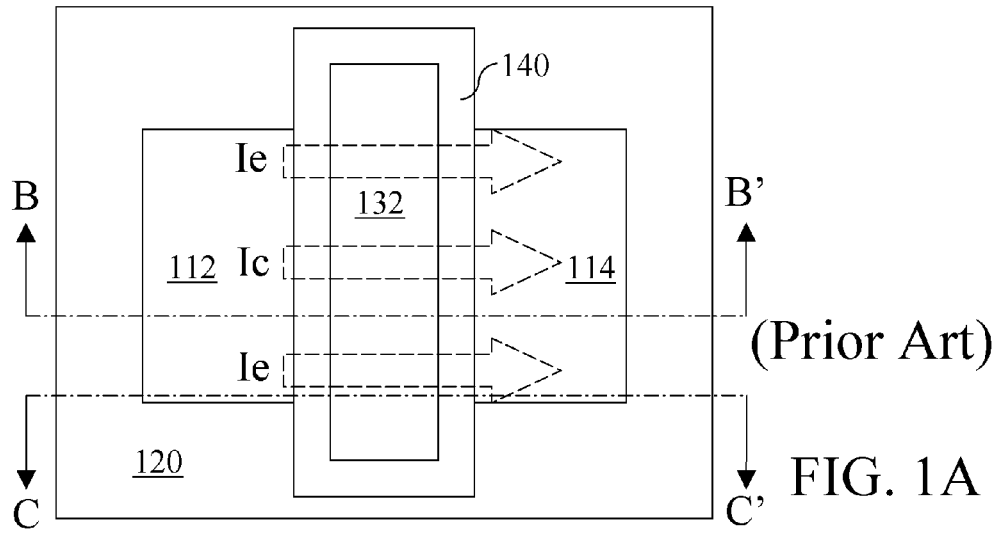
(Prior Art) FIG. 1A
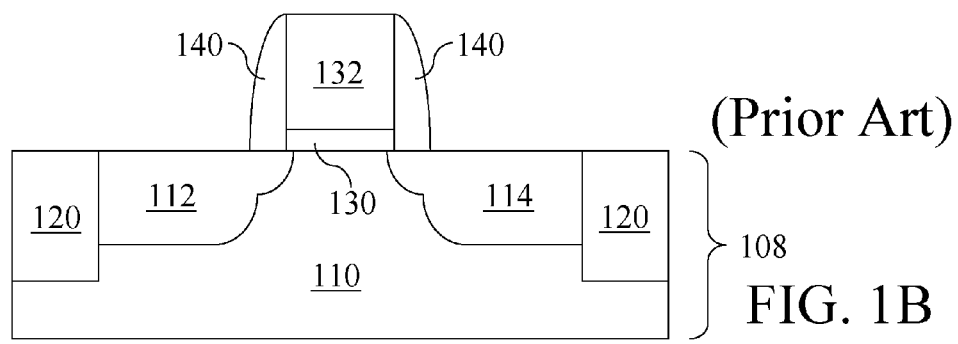
(Prior Art) FIG. 1B
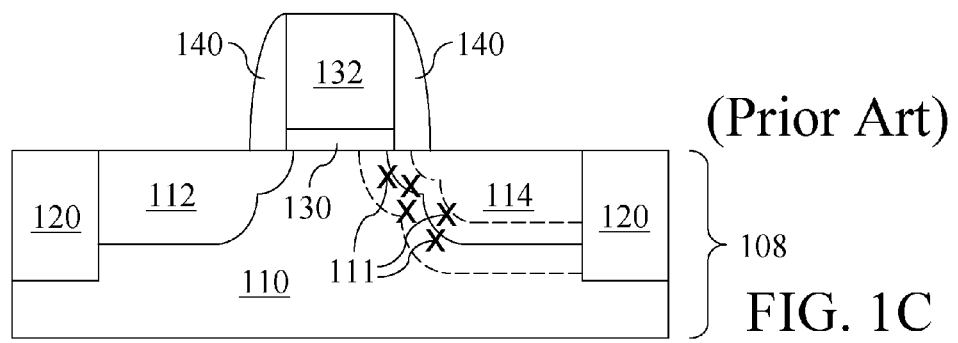
(Prior Art) FIG. 1C

FIELD EFFECT TRANSISTOR WITH REDUCED SHALLOW TRENCH ISOLATION INDUCED LEAKAGE CURRENT

FIELD OF THE INVENTION

The present invention relates to a semiconductor structure, and more particularly to a metal-oxide-semiconductor field effect transistor having a reduced shallow trench isolation induced leakage current, and methods of manufacturing the same.

BACKGROUND OF THE INVENTION

Shallow trench isolation is a method of providing electrical isolation between adjacent semiconductor devices in an integrated semiconductor circuit, which is typically implemented in a semiconductor chip. The shallow trench isolation is employed in both bulk substrates and in semiconductor-on-insulator (SOI) substrates and provides more effective electrical isolation than LOCOS (local oxidation of silicon) insulation, while using smaller area of the semiconductor chip.

A shallow trench isolation structure comprises a dielectric material that laterally surrounds active areas (AA) of a semiconductor substrate comprising a semiconductor material, which is typically silicon. The shallow trench isolation structure is formed by first patterning a shallow trench that laterally surrounds the active area, followed by deposition of a dielectric material into the shallow trench and a subsequent planarization of the deposited dielectric material. The dielectric material is typically removed from above the active areas during the planarization step, and the remaining portions of the dielectric material within the shallow trench, which are typically contiguous throughout a large area of the semiconductor chip, constitute the shallow trench isolation structure. The dielectric material employed in the shallow trench isolation structure is typically silicon oxide, which may be deposited by various chemical vapor deposition (CVD) methods known in the art. Optionally a dielectric liner is formed on the sidewalls and bottom surfaces of the shallow trench prior to the deposition of the dielectric material. The dielectric liner may comprise the same material as the dielectric material deposited by CVD, or may comprise a different material such as silicon nitride or silicon oxynitride.

Referring to FIGS. 1A-1C, a prior art metal-oxide-semiconductor field effect transistor MOSFET) structure comprises a semiconductor substrate 108 containing a shallow trench isolation structure 120 that laterally surrounds an active area, which includes a source region 112, a drain region 114, and a portion of a semiconductor layer 110 located above a bottom surface of the shallow trench isolation structure 120. FIG. 1A is a top-down view, FIG. 1B is a vertical cross-sectional view along the plane B-B', and FIG. 1C is a vertical cross-sectional view along the plane C-C'. The active area comprises the source region 112, the drain region 114, and the portion of the semiconductor layer above the level of the bottom surfaces of the shallow trench isolation structure 120. A gate electrode 132 separated from the semiconductor layer 110 by a gate dielectric straddles the boundaries between the active area and the shallow trench isolation structure. To insure that the gate electrode 132 fully overlaps the entire width of the active area even with overlay variations during manufacturing, the gate electrode 132 extends over the shallow trench isolation structure 120. Typically, the overextension of the gate electrode 132 is designed to be at least an overlay tolerance between the pattern for the gate electrode 132 and the active area (or the shallow trench isolation structure, which is the complement of the active area) to insure that the gate electrode 132 overlies the entire width of the active area. Gate spacers 140 are formed on the gate electrode 132 during the formation of the source region 112 and the drain region 114, which typically includes source and drain extension regions (not marked separately) that abut the gate dielectric 130 and deep source and drain regions (not marked separately) that extend deeper into the semiconductor substrate than the source and drain extension regions.

Charge carriers flow in the prior art MOSFET occurs from the source region 112 to the drain region 114. Specifically, electrons flow from the source region 112 to the drain region 114 for n-type MOSFETs, and holes flow from the source region 112 to the drain region 114 for p-type MOSFETs. Channel current Ic flows as the charge carriers, i.e., electrons or holes, flow in a channel located within the portion of the semiconductor layer 110 directly underneath the gate dielectric 130 in the direction of the arrow associated with the channel current Ic. Shallow trench isolation (STI) edge current Ie flows at the interfaces between the semiconductor layer 110 and the shallow trench isolation structure 120. The STI edge current is triggered by surface states generated by crystalline defects of the semiconductor layer 110 at the interface between the semiconductor layer 110 and the shallow trench isolation structure 120.

The STI edge current Ie may raise a significant performance issue due to its contribution to the total leakage current of the prior art MOSFET in an off-state. Particularly, the STI edge current Ie dominates the off-state leakage current in a narrow MOSFET, i.e., a MOSFET in which the width of the channel has a comparable dimension as the length of the channel, which is the distance between the source region 112 and the drain region 114. This is because the channel current Ic scales with the width of the channel, while the STI edge current Ie does not scale with the width of the channel, i.e., both a wide MOSFET and a narrow MOSFET have a pair of STI sidewalls that induce the STI edge current Ie. Thus, the STI edge current has a detrimental effect for narrow MOSFETs, such as MOSFETs in a static random access memory (SRAM) cell, that are employed in low leakage applications.

The surface states causing the STI edge current Ie can be caused by crystalline imperfections of the surface of the semiconductor layer 110 that laterally abut the shallow trench isolation structure, which is not aligned to any crystallographic orientations of the semiconductor layer 110 and thus necessarily contains crystallographic edges. Further, such a surface of the semiconductor layer also contains various surface defects 111 since chemicals employed in the etching step of the semiconductor layer 110 to form the shallow trenches form various point defects at the exposed sidewalls of the shallow trench, which become the surface of the semiconductor layer 110 that abut the shallow trench isolation structure. In addition, the dielectric material of the shallow trench isolation structure 120 induces surface states within the semiconductor layer 110 near the interface. Thus, surface states caused by various mechanisms including the surface 111 defects that occur within a depletion region the around the p-n junction between the semiconductor layer 110 and the drain 114 induce the STI edge current Ie. The depletion region is represented by the area of the semiconductor layer 110 and the drain region 114 that are bounded by the two broken lines in FIG. 1C.

In view of the above, there exists a need for a semiconductor structure that provides reduced off-state leakage current for a metal-oxide-semiconductor field effect transistor (MOSFET), and methods of manufacturing the same.

In particular, there exists a need for a semiconductor structure that eliminates or reduces an STI edge current especially for narrow field effect transistors and low power devices, and methods of manufacturing the same.

SUMMARY OF THE INVENTION

To address the needs described above, the present invention provides a semiconductor structure in which a gate electrode does not overlie any interface between a shallow trench isolation structure and source and drain regions, thus eliminating any shallow trench isolation edge current, and methods of manufacturing the same.

In the present invention, edges of source and drain regions along the direction of a channel of a field effect transistor are formed within an active area offset from the boundary between the active area and a shallow trench isolation structure. Such a structure may be manufactured by forming a gate electrode structure that overlies the boundary so that edges of the source and drain regions are self aligned to the edges of the gate electrode structure on the active area side of the boundary. Unnecessary portions of the gate electrode that do not overlie the source and drain regions may be removed to reduce parasitic capacitance. Shallow trench isolation edge current is eliminated since the semiconductor regions in the current path of the field effect transistor are offset from the boundary between the active area and the shallow trench isolation structure.

According to an aspect of the present invention, a semiconductor structure is provided, which comprises:

a semiconductor portion located in a semiconductor substrate, having a first lengthwise sidewall, a second lengthwise sidewall, a first widthwise sidewall, and a second widthwise sidewall, and including a body region, a source region abutting the body region, and a drain region abutting the body region and disjoined from the source region;

a shallow trench isolation structure located in the semiconductor substrate and laterally surrounding and abutting the semiconductor portion, wherein the source region laterally abuts the first widthwise sidewall, the drain region laterally abuts the second widthwise sidewall, and the source region and the drain region are separated from the first and second sidewalls by the body region; and a gate electrode overlying an edge of the source region and an edge of the drain region.

In one embodiment, the gate electrode overlies the first lengthwise sidewall and the second lengthwise sidewall.

In another embodiment, the gate electrode has a shape of a letter "H," and two vertical lines of the letter "H" correspond to portions of the gate electrode that overlie the first lengthwise sidewall and the second lengthwise sidewall, respectively.

In even another embodiment, the gate electrode overlies an entirety of the first lengthwise sidewall and an entirety of the second lengthwise sidewall.

In yet another embodiment, the first and second lengthwise sidewalls are located outside an area that overlies the gate electrode.

In still another embodiment, the first widthwise sidewall is the only area at which the source region abuts the shallow trench isolation structure, and wherein the second widthwise sidewall is the only area at which the drain region abuts the shallow trench isolation structure.

In still yet another embodiment, each of the first and second lengthwise sidewalls is directly adjoined to the first widthwise sidewall and the second widthwise sidewall.

In a further embodiment, the semiconductor portion is substantially rectangular.

In an even further embodiment, the body region has a doping of a first conductivity type and the source region and the drain region has a doping of a second conductivity type, wherein the second conductivity type is the opposite of the first conductivity type.

In a yet further embodiment, the semiconductor structure further comprises:

a gate dielectric vertically abutting a portion of the body region, a portion of the source region, a portion of the drain region, and the gate electrode; and a gate spacer laterally abutting and laterally enclosing the gate dielectric and the gate electrode.

In a still further embodiment, the gate spacer vertically abuts the first and second widthwise edges and is disjoined from the first and second lengthwise sidewalls.

In a still yet further embodiment, the semiconductor structure further comprises:

a gate dielectric vertically abutting a portion of the body region, a portion of the source region, a portion of the drain region, and the gate electrode;

a first gate spacer portion laterally abutting the gate dielectric and the gate electrode and vertically abutting the source region; and a second gate spacer portion laterally abutting the gate dielectric and the gate electrode, vertically abutting the drain region, and disjoined from the first gate spacer.

In a further another embodiment, the first and second gate spacer portions are located within an area of said semiconductor portion.

According to another aspect of the present invention, a semiconductor structure is provided, which comprises:

a semiconductor portion located in a semiconductor substrate and including a body region, a source region abutting the body region, and a drain region abutting the body region and disjoined from the source region;

a shallow trench isolation structure located in the semiconductor substrate and laterally surrounding and abutting the semiconductor portion, wherein the source region and the drain region are separated from the shallow trench isolation structure by the body region; and a gate electrode overlying an edge of the source region and an edge of the drain region.

In one embodiment, the body region has a doping of a first conductivity type and the source region and the drain region have a doping of a second conductivity type which is an opposite conductivity type of the first conductivity type.

In another embodiment, the semiconductor structure further comprises:

a gate dielectric vertically abutting a portion of the body region, a portion of the source region, a portion of the drain region, and the gate electrode;

a first gate spacer portion laterally abutting the gate dielectric and the gate electrode and vertically abutting the source region; and a second gate spacer portion laterally abutting the gate dielectric and the gate electrode, vertically abutting the drain region, and disjoined from the first gate spacer.

According to yet another aspect of the present invention, a method of forming a semiconductor structure is provided, which comprises:

providing a semiconductor portion having a first lengthwise sidewall, a second lengthwise sidewall, a first widthwise sidewall, and a second widthwise sidewall in a semiconductor substrate, wherein each of the first and second lengthwise sidewalls is directly adjoined to the first widthwise sidewall and the second widthwise sidewall;

forming a gate electrode overlying the first and second widthwise sidewalls and a middle portion of the semiconductor portion, wherein the middle portion is located between the first and second widthwise sidewalls; and forming a source region and a drain region within the semiconductor portion, wherein the source region is formed on one side of the middle portion and the drain region is formed on another side of the middle portion, and wherein each of the source region and the drain region is disjoined from the first and second lengthwise sidewalls.

In one embodiment, the method further comprises forming a gate dielectric on the semiconductor portion, wherein the gate electrode is formed directly on the gate dielectric.

In another embodiment, the semiconductor portion has a doping of a first conductivity type, and wherein the method further comprises implanting dopants of a second conductivity type, which is the opposite of the first conductivity type, into the semiconductor portion employing the gate electrode as an implantation mask to form the source region and the drain region.

In even another embodiment, the method further comprises forming a gate spacer directly on the gate electrode, wherein the gate spacer laterally encloses the gate electrode.

In yet another embodiment, the method further comprises implanting more dopants of the second conductivity type into the semiconductor portion employing the gate spacer as an implantation mask.

In still another embodiment, the method further comprises removing a portion of the gate electrode from above a portion of the first lengthwise sidewall and a portion of the second lengthwise sidewall and thereby exposing a portion of the shallow trench isolation structure.

In a further embodiment, the method further comprises the gate electrode is removed from above an entirety of the first lengthwise sidewall and the second lengthwise sidewall.

In an even further embodiment, the method further comprises:

exposing two sidewalls of the gate electrode and two sidewalls of the gate dielectric during the removing of the portion of the gate dielectric; and forming a dielectric material layer directly on the two sidewalls of the gate electrode and the two sidewalls of the gate dielectric.

In a yet further embodiment, the two sidewalls of the gate electrode overlies the shallow trench isolation structure In a still further embodiment, each of the two sidewalls of the gate electrode overlies a portion of the body region, a portion of the source region, a portion of the drain region, and is located inside an area of the semiconductor portion.

BRIEF DESCRIPTION OF THE DRAWINGS

FIGS. 1A-1C show a prior art metal-oxide-semiconductor field effect transistor. FIG. 1A is a top-down view; FIG. 1B is a vertical cross-sectional view along the plane B-B'; and FIG. 1C is a vertical cross-sectional view along the plane C-C'.

" FIG. 7C is a vertical cross-sectional view of the second semiconductor structure of FIG. 7A along the plane C-C'. FIG. 7D is a horizontal cross-sectional view along the plane D-D' of FIGS. 7B and 7C. Figures with the same numeric label correspond to a same stage of a manufacturing process.

FIG. 14A is a top-down view. FIG. 14B is a vertical cross-sectional view along the plane B-B' of FIG. 14A. FIG. 14C is a vertical cross-sectional view along the plane C-C' of FIG. 14A.

DETAILED DESCRIPTION OF THE INVENTION

Figure 2A:
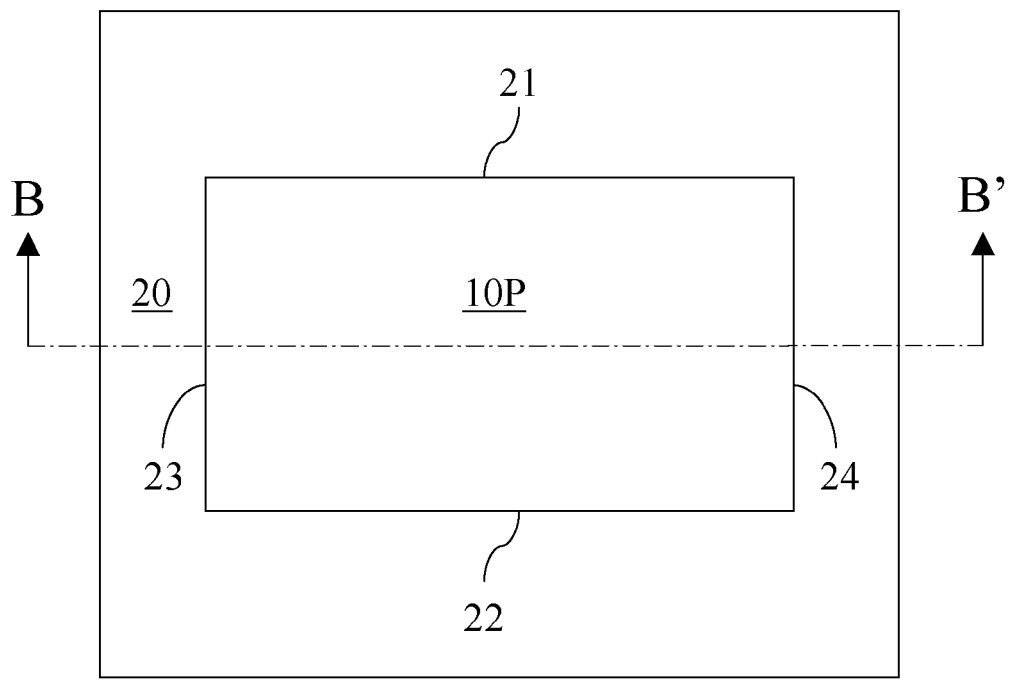
FIGS. 2A and 2B, and 3A-4D are sequential views of a first exemplary semiconductor structure according to a first embodiment of the present invention. Figures with the suffix "A" are top-down views. Figures with the suffix "B" or "C" are vertical cross-sectional views along the plane B-B' or C-C', respectively, of the corresponding figure with the same numeric label and the suffix "A." Figures with the suffix "D" are horizontal cross-sectional views along the plane D-D' of the corresponding figure with the same numeric label and the suffix "B" or "C." Figures with the same numeric label correspond to a same stage of a manufacturing process.

As stated above, the present invention relates to a metal-oxide-semiconductor field effect transistor having a reduced shallow trench isolation induced leakage current, and methods of manufacturing the same, which are now described in detail with accompanying figures. It is noted that like and corresponding elements are referred to by like reference numerals.

Referring to FIG. 2, a first exemplary semiconductor structure according to a first embodiment of the present invention comprises a semiconductor substrate 8 containing a semiconductor layer 10 and a shallow trench isolation structure 20. The semiconductor layer 10 comprises a semiconductor portion 10P located above a bottom surface of the shallow trench isolation structure 20 and an underlying semiconductor layer 10U located beneath the bottom surface of the shallow trench isolation structure 20. The semiconductor substrate 8 may be a bulk substrate in which the semiconductor portion 10P is integrally formed with, and epitaxially aligned to, the underlying semiconductor layer 10U, which consists of the same semiconductor material as the semiconductor material of the semiconductor portion 10P. In this case, the entirety of the semiconductor layer is single crystalline. Alternately, the semiconductor substrate 8 may be a semiconductor-on-insulator (SOI) substrate in which the underlying semiconductor portion 10 comprises a buried dielectric layer (not shown) abutting the bottom surface of the shallow trench isolation structure and a handle substrate (not shown) located beneath the buried dielectric layer.

The semiconductor portion 10 comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise silicon. Preferably, the semiconductor portion 10 is single crystalline.

The shallow trench isolation structure 20 comprises a dielectric material such as silicon oxide. The shallow trench isolation structure 20 is formed by methods known in the art, i.e., by patterning a shallow trench that surrounds the semiconductor portion 10P within the semiconductor substrate 8, followed by deposition and planarization of the dielectric material so that the remaining portions of the dielectric material after the planarization constitutes the shallow trench isolation structure 20. After the formation of the shallow trench isolation structure 20, the semiconductor portion 10P has a first lengthwise sidewall 21, a second lengthwise sidewall 22, a first widthwise sidewall 23, and a second widthwise sidewall 24, which collectively constitute a lateral boundary that laterally encloses the semiconductor portion 10P.

The first lengthwise sidewall 21 is directly adjoined to the first widthwise sidewall 23 and the second widthwise sidewall 24. The second lengthwise sidewall 22 is also directly adjoined to the first widthwise sidewall 23 and the second widthwise sidewall 24. The first lengthwise sidewall 21 is substantially parallel to the second lengthwise sidewall 22. The direction of the first lengthwise sidewall 21 and the second lengthwise sidewall 22 is herein referred to as a lengthwise direction. The first widthwise sidewall 23 may, or may not, be substantially parallel to the second widthwise sidewall 24. If the direction of the first widthwise sidewall 23 is parallel to the direction of the second widthwise sidewall 24, the common direction of the first and second widthwise sidewalls (23, 24) is herein referred to as a widthwise direction. The lengthwise direction and the widthwise direction may, or may not, be orthogonal to each other. If the lengthwise direction and the widthwise direction are orthogonal to each other, the lateral boundary is rectangular. While the present invention is described with a rectangular shaped semiconductor portion 10P, embodiments in which any of the first and second lengthwise sidewalls (21, 22) and the first and second widthwise sidewalls (23, 24) comprise multiple segments that are adjoined to each other at an angle (not equal to 180 degrees) are explicitly contemplated herein. In general, the semiconductor portion 10P may have a polygonal lateral boundary.

The semiconductor portion 10 is typically doped with electrical dopants such as B, Ga, In, P, As, Sb, or a combination thereof. The type of doping for the semiconductor portion is herein referred to as a first conductivity type doping, which may be a p-type doping or an n-type doping. The dopant concentration of the semiconductor portions 10P may be from about $1.0 \times 10^{14}/cm^3$ to about $1.0 \times 10^{19}/cm^3$, and preferably from about $1.0 \times 10^{15}/cm^3$ to about $1.0 \times 10^{18}/cm^3$, although lesser and greater dopant concentrations are explicitly contemplated herein.

Referring to FIGS. 3A-3D, a gate dielectric 30 and a gate electrode 32 are formed over the semiconductor substrate 8. Specifically, a gate dielectric layer (not shown) is formed directly on a top surface of the semiconductor portion 10P. If the gate dielectric layer is formed by thermal conversion of the semiconductor material of the semiconductor portion 10P, the gate dielectric layer is formed selectively on the top surface of the semiconductor portion 10P. If the gate dielectric layer is formed by chemical vapor deposition (CVD), atomic layer deposition (ALD), or physical vapor deposition (PVD), the gate dielectric layer is formed on the top surface of the semiconductor portion 10P and the top surface of the shallow trench isolation structure 20. The gate dielectric layer may comprise a silicon oxide based dielectric layer such as silicon oxide ($SiO_2$), silicon oxynitride ($SiO_xN_y$), or a combination thereof. The value of x in $SiO_xN_y$ may be from 0 to about 2, and the value of y in $SiO_xN_y$ may be from 0 to about 4/3. Alternately, the gate dielectric layer may comprises a dielectric metal oxide material known as high-k gate dielectric materials. Non-limiting examples of the dielectric meal oxide material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The effective oxide thickness (EOT) of the gate dielectric layer may be from about 0.9 nm to about 6 nm, and preferably from about 1.2 nm to about 3 nm.

A gate electrode layer is then formed on the gate dielectric layer by methods known in the art including low pressure chemical vapor deposition (LPCVD), rapid thermal chemical vapor deposition (RTCVD), plasma enhanced chemical vapor deposition (PECVD), physical vapor deposition (PVD), etc. The gate electrode layer may comprise a semiconductor material such as silicon, germanium, carbon, a III-V compound semiconductor material, a II-VI compound semiconductor material, or an alloy thereof. Alternately or in addition, the gate electrode layer may comprise a metallic material that is typically employed in metal gate structures. The metallic material may be an elemental metal, a metal alloy, a conductive metallic nitride, or a combination thereof. The thickness of the gate electrode layer may be from about 6 nm to about 200 nm, and typically from about 30 nm to about 120 nm, although lesser and greater thicknesses are explicitly contemplated herein.

The stack of the gate dielectric layer and the gate electrode layer are lithographically patterned to form the gate dielectric 30 and the gate electrode 32. Typically, a photoresist (not shown) is applied over the gate electrode layer and lithographically patterned. The pattern formed by the remaining portion of the photoresist after exposure is transferred into the stack of the gate dielectric layer and the gate electrode layer. The pattern in the photoresist is set such that the gate electrode 32 overlies a middle portion of the semiconductor portion, the entirety of the first lengthwise sidewall 21, and the entirety of the second lengthwise sidewall 22. Thus, the gate electrode 32 straddles the semiconductor portion 10P and the shallow trench isolation structure 20 around the entirety of the first lengthwise sidewall 21 and around the entirety of the second lengthwise sidewall 22. If the semiconductor portion 10P is rectangular, the gate electrode may have a shape of a letter "H," two vertical lines of which correspond to portions of the gate electrode 32 that overlie the first lengthwise sidewall 21 and the second lengthwise sidewall 22, respectively.

Dopants of a second conductivity type are implanted into the semiconductor portion 10P employing the gate electrode 32 as an implantation mask. The second conductivity type is the opposite of the first conductivity type, i.e., if the first conductivity type is p-type, the second conductivity type is n-type, and vice versa. An implanted region within the semiconductor portion 10P on one side of the middle portion constitutes a source region 12, while another implanted region within the semiconductor portion 10P on the other side of the middle portion constitutes a drain region 14. The dopant concentration of the source region 12 and the drain region 14 may be from about $1.0\times10^{19}/cm^3$ to about $1.0\times10^{21}/cm^3$, and preferably from about $1.0\times10^{20}/cm^3$ to about $5.0\times10^{20}/cm^3$, although lesser and greater dopant concentrations are explicitly contemplated herein. The remaining unimplanted region of the semiconductor portion 10P constitutes a body region 10B having a doping of the first conductivity type. Thus, the semiconductor portion 10P comprises the source region 12, the drain region 14, and the body region 10B. The body region 10B and the underlying semiconductor layer 10U collectively constitute the semiconductor layer 10, which may have the same composition and epitaxially aligned.

Such a source region 12 is also termed a source extension region in the art since it extends underneath the gate electrode 32. Likewise, such a drain region 14 is also termed a drain extension region in the art since it extends underneath the gate electrode 32. In other words, the source region 12 and the drain region 14 overlap portions of the gate electrode 32. Specifically, a widthwise source region edge 13, which is an edge running in the widthwise direction and located between the source region 12 and the body region 10B on the top surface of the semiconductor portion (10B, 12, 14), underlies the middle portion of the gate electrode 32 that corresponds to a horizontal bar in the shape of the letter "H." Likewise, a widthwise drain region edge 15, which is an edge running in the widthwise direction and located between the drain region 14 and the body region 10B on the top surface of the semiconductor portion (10B, 12, 14), also underlies the middle portion of the gate electrode 32 that corresponds to a horizontal bar in the shape of the letter "H."

Figure 3A:
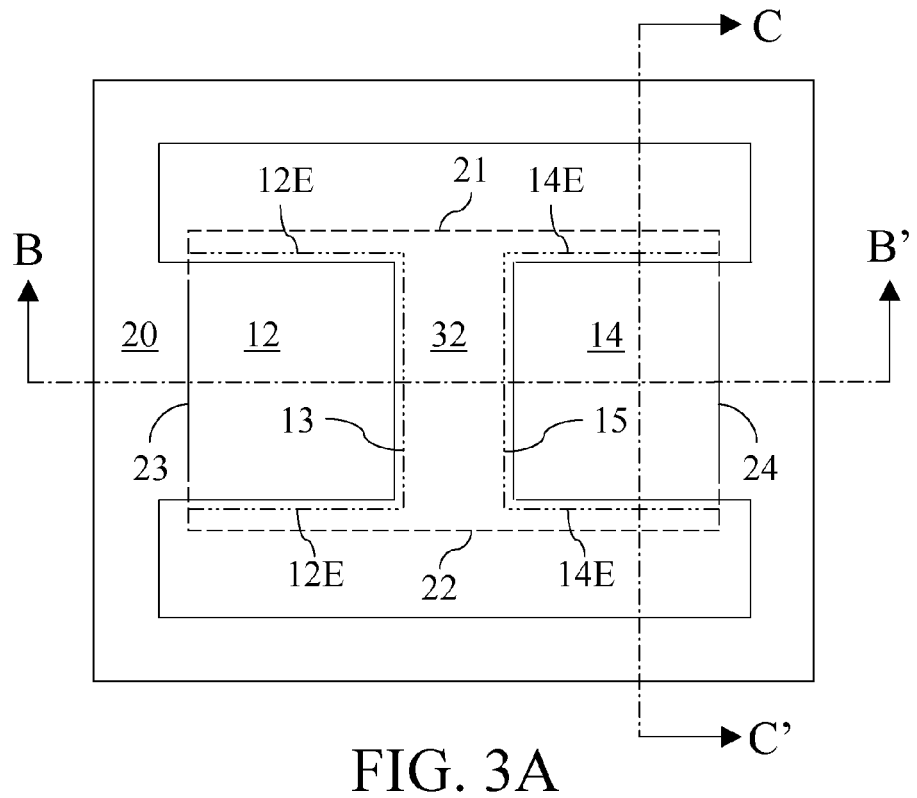
Figure 3B:
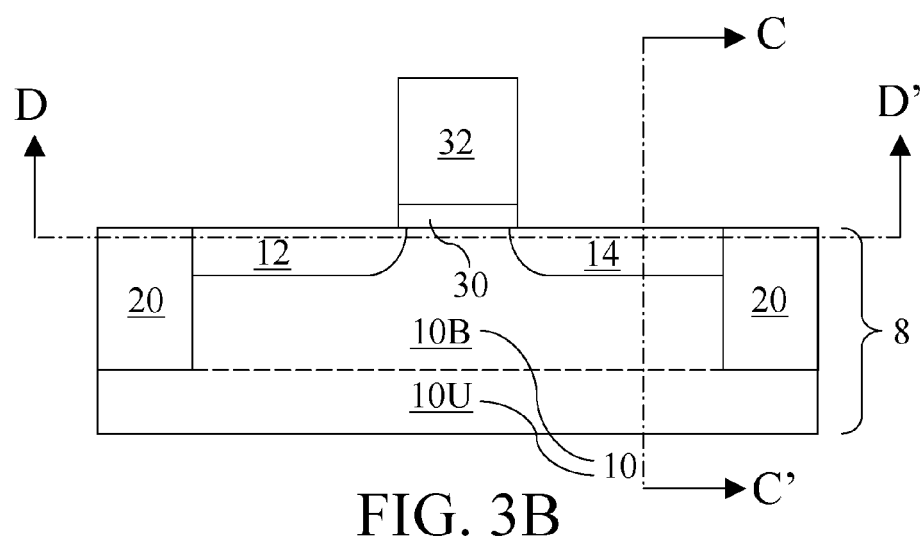
Figure 3C:
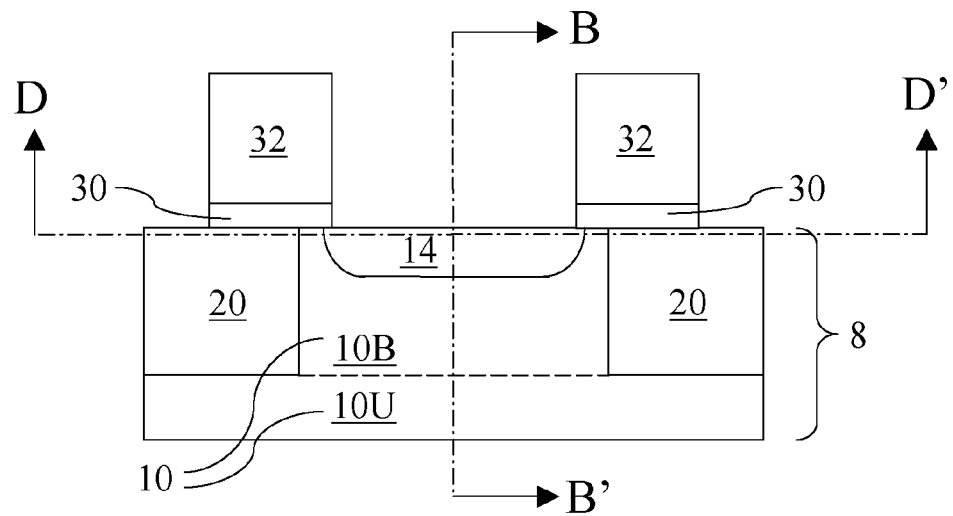
Figure 3D:
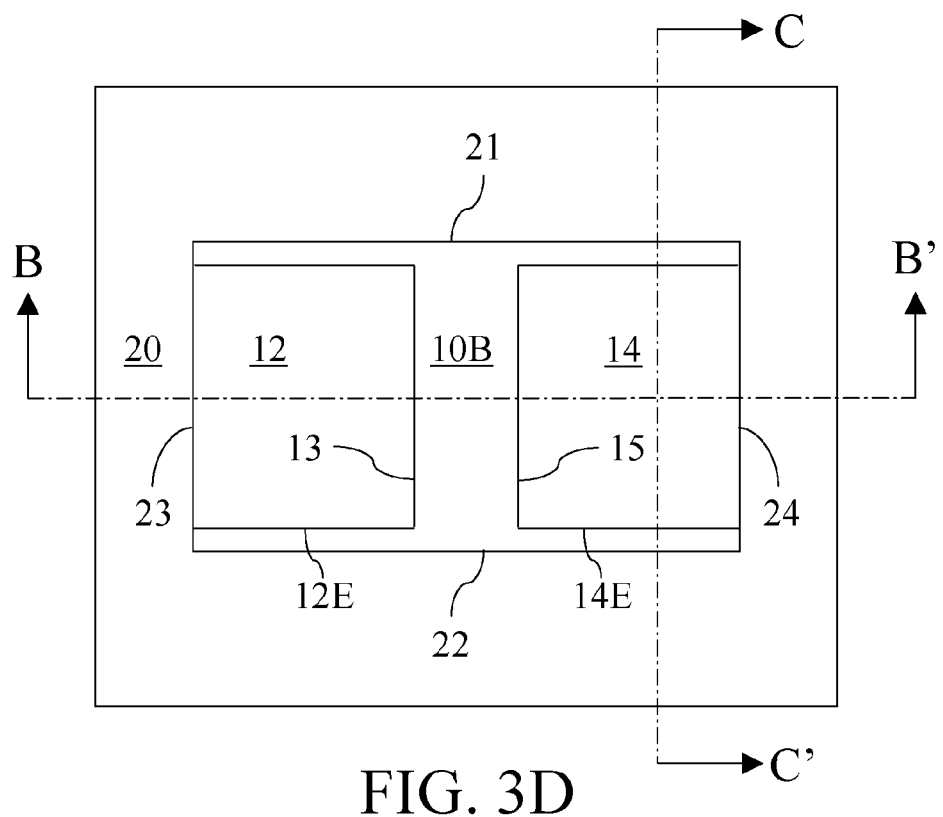

Lengthwise source region edges 12E, which are edges running in the lengthwise direction and located between the source region 12 and the body region 1013 on the top surface of the semiconductor portion (10B, 12, 14), underlies the portion of the gate electrode 32 that corresponds to one vertical line in the shape of the letter "H." Likewise, lengthwise drain region edges 14E, which are edges running in the lengthwise direction and located between the drain region 14 and the body region 100B on the top surface of the semiconductor portion (10B, 12, 14), underlies the portion of the gate electrode 32 that corresponds to the other vertical line in the shape of the letter "H." While the lengthwise source region edges 12E and the lengthwise drain region edges 14E are not visible in a true top-down view at this step, they are shown in double dotted lines for comparison of the relative portions of the gate electrode 32 and the lengthwise source region edges 12E and the lengthwise drain region edges 14E in the to-down view of FIG. 3A. Further, the first and second lengthwise sidewalls (21, 22) and the masked portions of the first and second widthwise sidewalls (23, 24), while not visible in a true top-down view at this step, are marked by broken lines in the top-down view of FIG. 3A.

According to the present invention, the lengthwise source region edges 12E and the lengthwise drain region edges 14E are formed within the semiconductor portion (10B, 12, 14). The shape of the gate electrode 32 is configured to insure that lateral straggle and diffusion of the second conductivity type dopants implanted to form the source region 12 and the drain region 14 are not placed in proximity to the first and second lengthwise sidewalls (21, 22) in any significant quantity. Thus, the body region 10B having a doping of the first conductivity type laterally abuts the shallow trench isolation structure 20 at the first and second lengthwise sidewalls (21, 22). Further, the body region 10B laterally abuts end portions of the first and second widthwise sidewalls (23, 24) at the top surface of the semiconductor portion (10B, 12, 14). Thus, the first widthwise sidewall 23 is the only area at which the source region 12 abuts the shallow trench isolation structure 20, and the second widthwise sidewall 24 is the only area at which the drain region 14 abuts the shallow trench isolation structure 20.

Referring to FIGS. 4A-4D, a gate spacer 40 is formed directly on the sidewalls of the gate electrode 32 and the sidewalls of the gate dielectric 30. For example, the gate spacer 40 may be formed by a substantially conformal deposition of a dielectric layer, followed by an anisotropic ion etch that removes horizontal portions of the dielectric layer so that the remaining portions of the dielectric layer on substantially vertical sidewalls of the gate electrode 32 and the substantially vertical sidewalls of the gate dielectric 30. The gate spacer 40 is formed as a single contiguous piece that laterally encloses the gate electrode 32.

Typically, more dopants of the second conductivity type are implanted into the semiconductor portion (10B, 12, 14) employing the gate spacer 40 as an implantation mask. Typically, the energy of the second conductivity dopants at this step is set such that the depth of implantation is greater than the depth of implantation of the second conductivity dopants in the previous implantation step corresponding to FIGS. 3A-3D. Thus, the source region 12 and the drain region 14 expand downward to include the newly implanted regions within the semiconductor portion (10B, 12, 14), while the body region 10B shrinks in volume accordingly. The portion of the source region 12 having the increased depth is termed a deep source region in the art, and the portion of the drain region 14 having the increased depth is termed a deep drain region in the art.

Figure 4A:
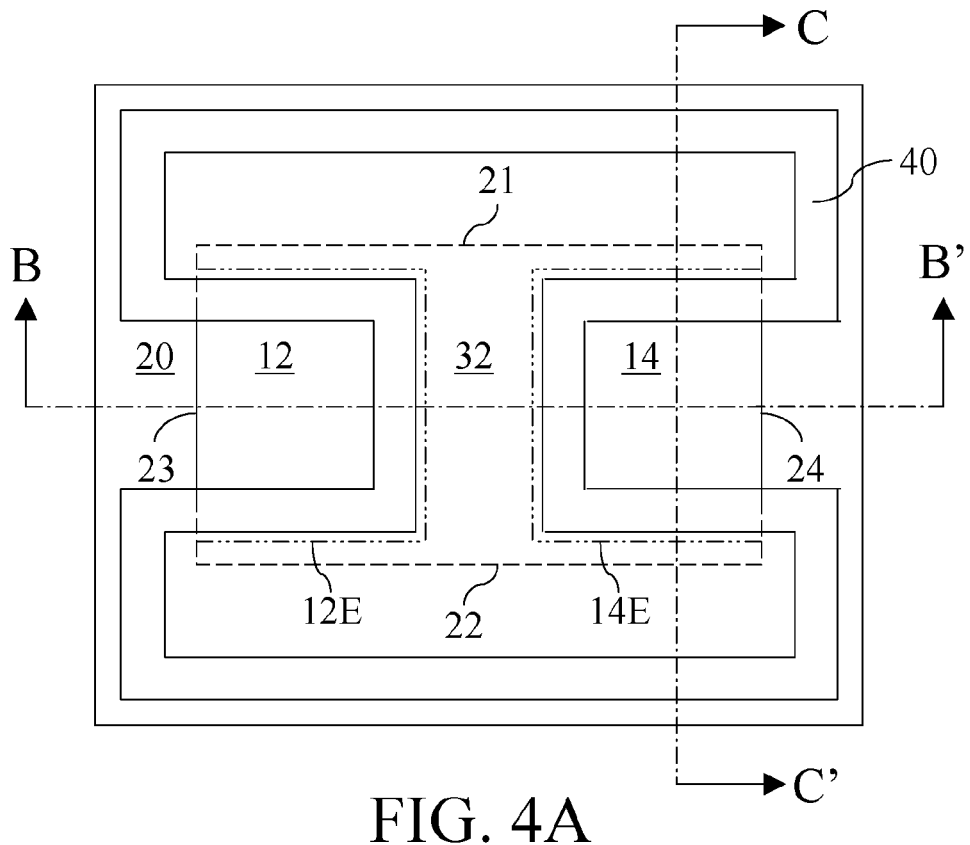
Figure 4B:
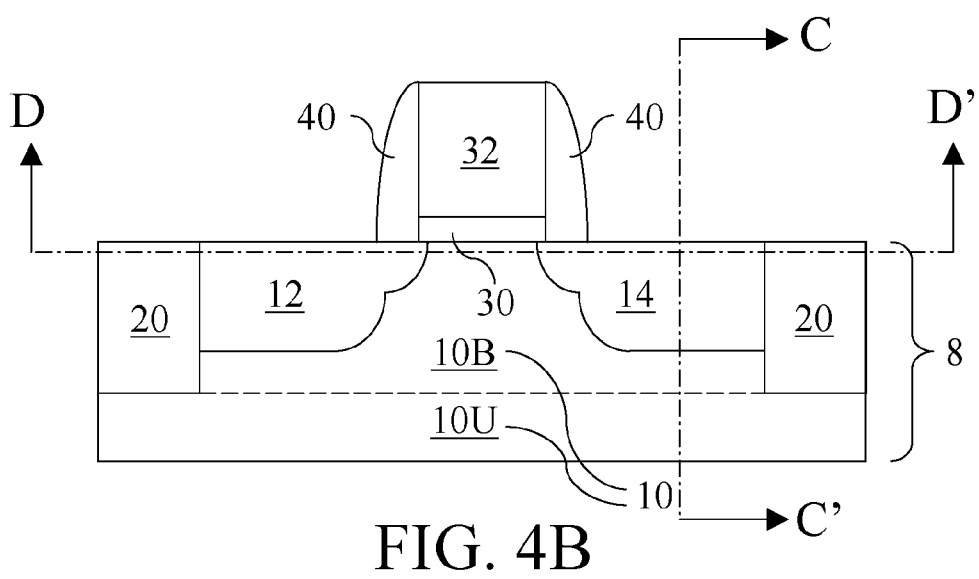
Figure 4C:
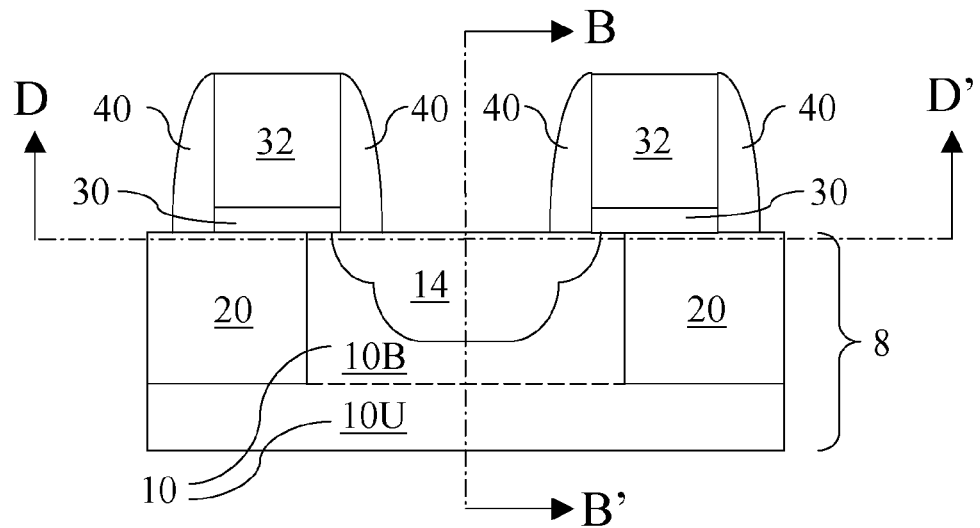
Figure 4D:
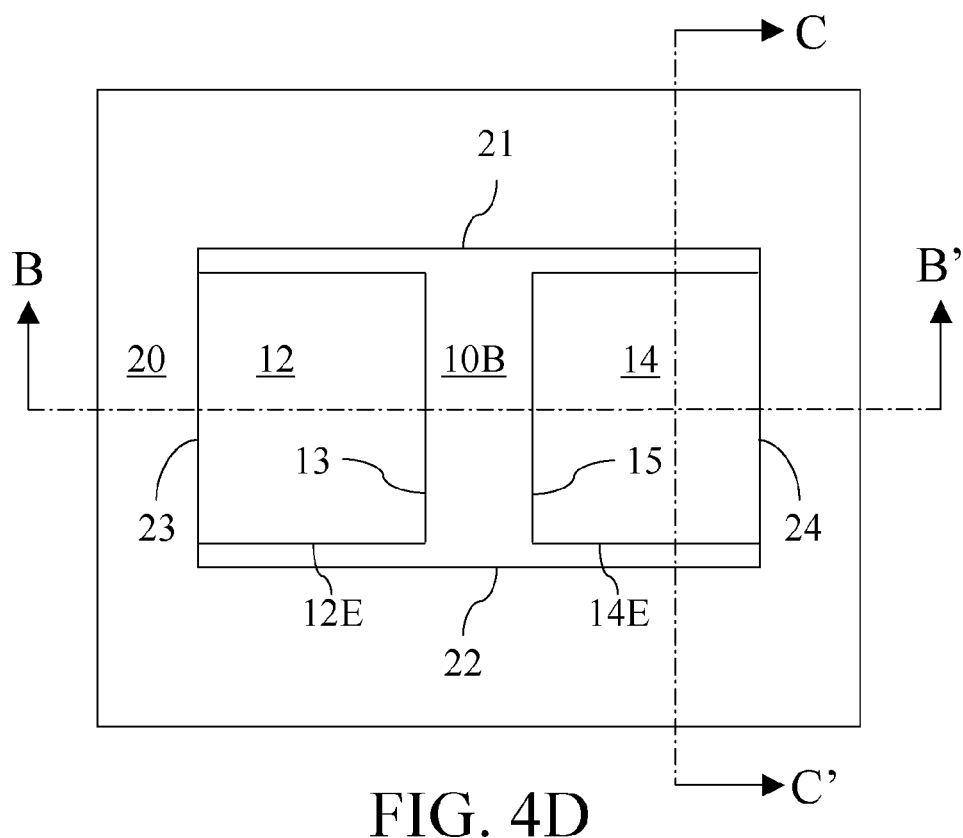

While the lengthwise source region edges 12E and the lengthwise drain region edges 14E are not visible in a true top-down at this step, they are shown in double dotted lines for comparison of the relative portions of the gate electrode 32, the gate spacer 40, the lengthwise source region edges 12E, and the lengthwise drain region edges 14E in the top-down view of FIG. 4A. Further, the first and second lengthwise sidewalls (21, 22) and the masked portions of the first and second widthwise sidewalls (23, 24), while not visible in a true top-down view at this step, are marked by broken lines in the top-down view of FIG. 4A.

The gate spacer 40 does not cross over the first or second lengthwise sidewalls (21, 22), but overlies two portions of the first widthwise sidewall 23 and two portions of the second widthwise sidewall 24. Thus, the gate spacer 40 vertically abuts the first and second widthwise edges 24 and is disjoined from the first and second lengthwise sidewalls (23, 24). Since the ion implantation does not extend the lateral area of the source region 12 or the drain region 14, but extends the source region 12 and the drain region 14 only vertically, the first widthwise sidewall 23 is still the only area at which the source region 12 abuts the shallow trench isolation structure 20, and the second widthwise sidewall 24 is still the only area at which the drain region 14 abuts the shallow trench isolation structure 20.

A dielectric material layer (not shown) may be deposited over the gate electrode 32, the gate spacer 40, the source region 12, the drain region 14, and the shallow trench isolation structure. Various contact via holes (not shown) are formed in the dielectric material layer and filled with metal to from various contact vias (not shown). A first level metal wiring (not shown) is thereafter formed followed by further formation of additional back-end-of-line (BEOL) structures (not shown).

Figure 5A:
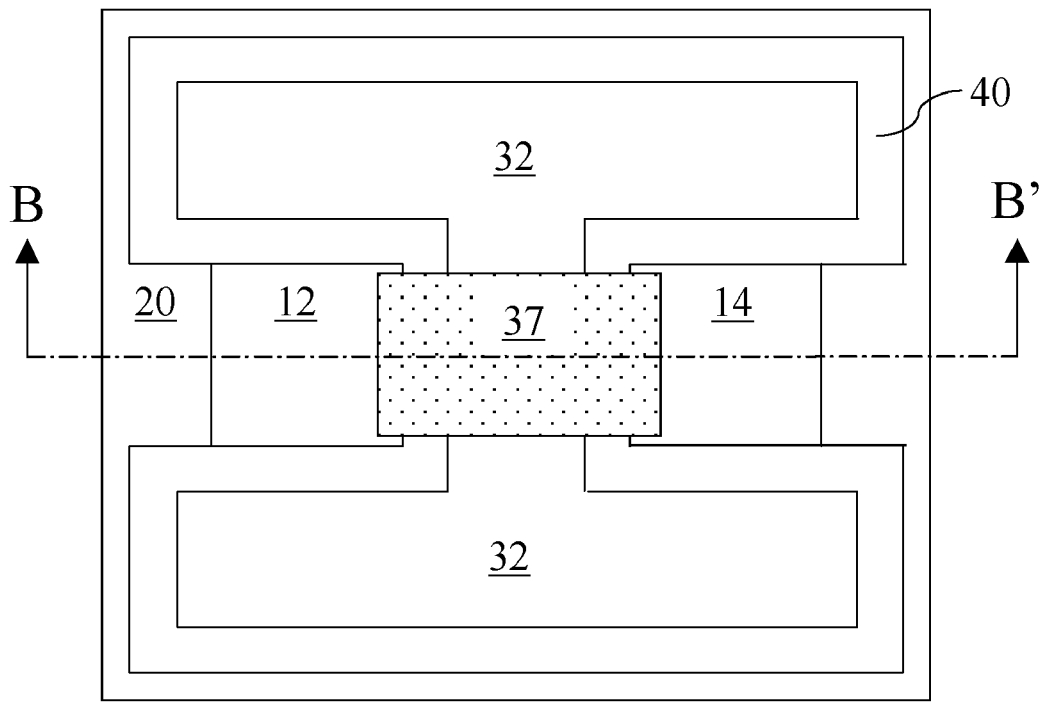
FIGS. 5A, 5B, 6A, 6B, and 7A-7D are sequential views of a second exemplary semiconductor structure according to a second embodiment of the present invention. Figures with the suffix "A" are top-down views. Figures with the suffix "B" are vertical cross-sectional views along the plane B-B' of the corresponding figure with the same numeric label and the suffix "A.
Figure 5B:
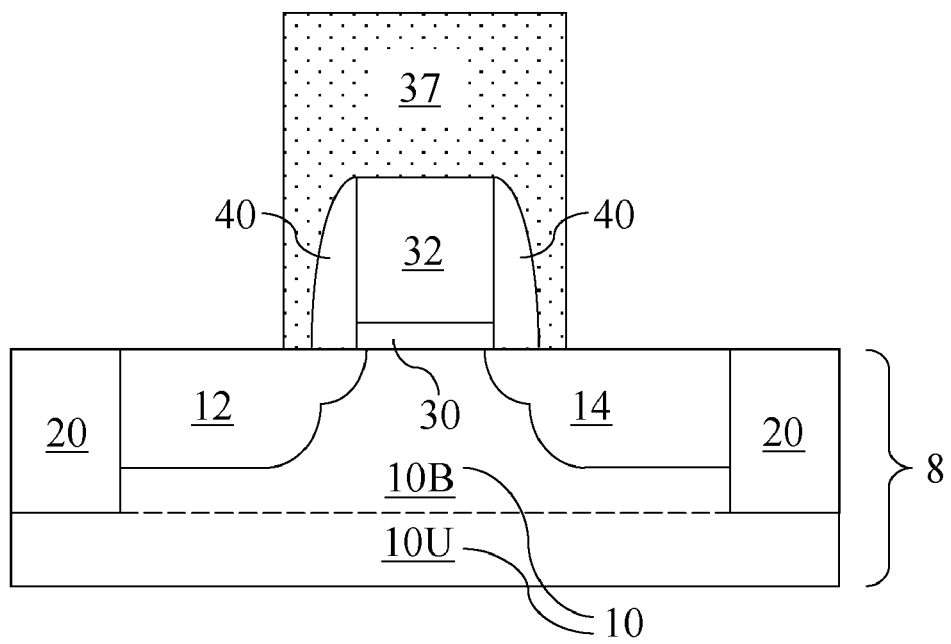

Referring to FIGS. 5A and 5B, a second exemplary semiconductor structure according to a second embodiment of the present invention is derived from the first exemplary semiconductor structure of FIGS. 4A-4D according to the present invention. A photoresist 37 is applied over the gate electrode 32, the gate spacer 40, the source region 12, and the drain region 14, and is lithographically patterned to cover a portion of the gate electrode 32 that corresponds to a center portion of the horizontal bar in the shape of the letter "H." The portions of the gate electrode 32 that correspond to the two vertical lines in the shape of the letter "H" are not covered by the photoresist 37. The portions of the gate electrode 32 that corresponds to end portions of the horizontal bar in the shape of the letter "H" may, or may not be underlie the photoresist 37. Practically, due to overlay limitations between the gate electrode 32 and the photoresist 37, some portions of the gate electrode 32 that corresponds to end portions of the horizontal bar in the shape of the letter "H" are outside the area covered the photoresist 37, i.e., do not underlie the photoresist 37. The edges of the photoresist 37 thus intersect the gate electrode 32 and the gate dielectric 40 along two lines in the lengthwise direction.

Figure 6A:
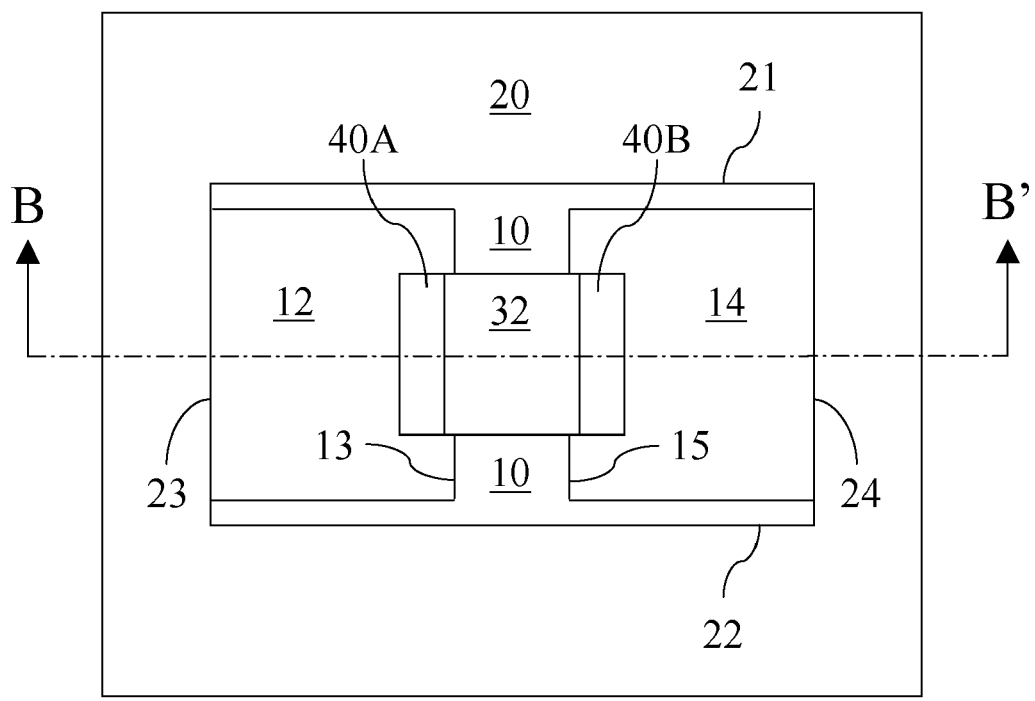
Figure 6B:
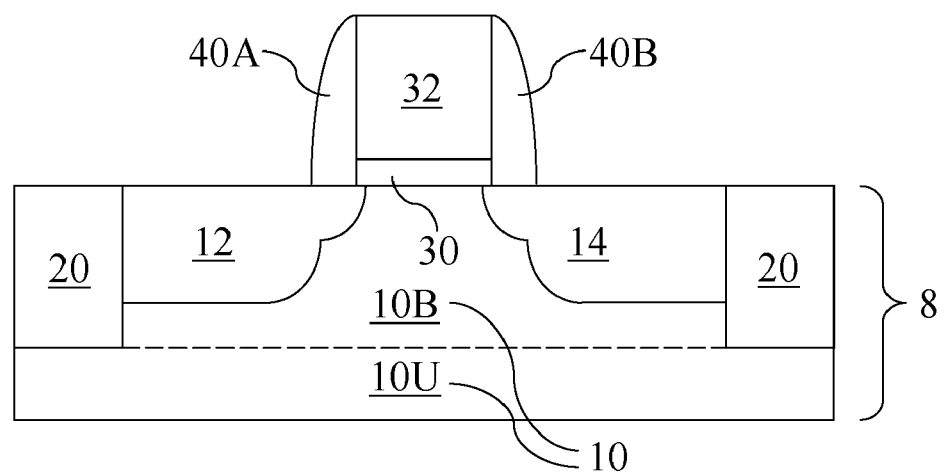
Figure 7A:
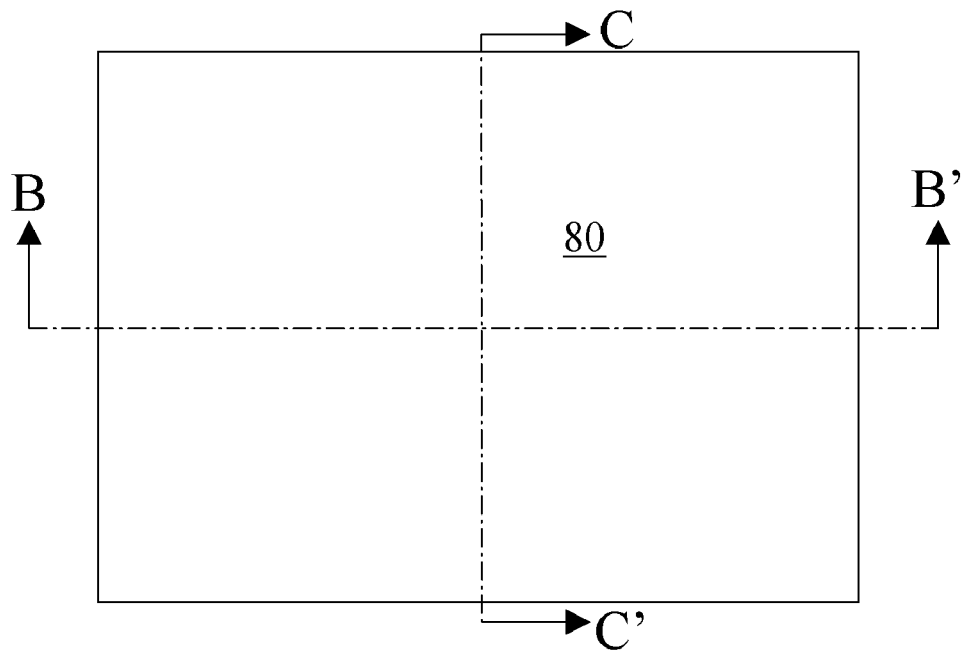
Figure 7B:
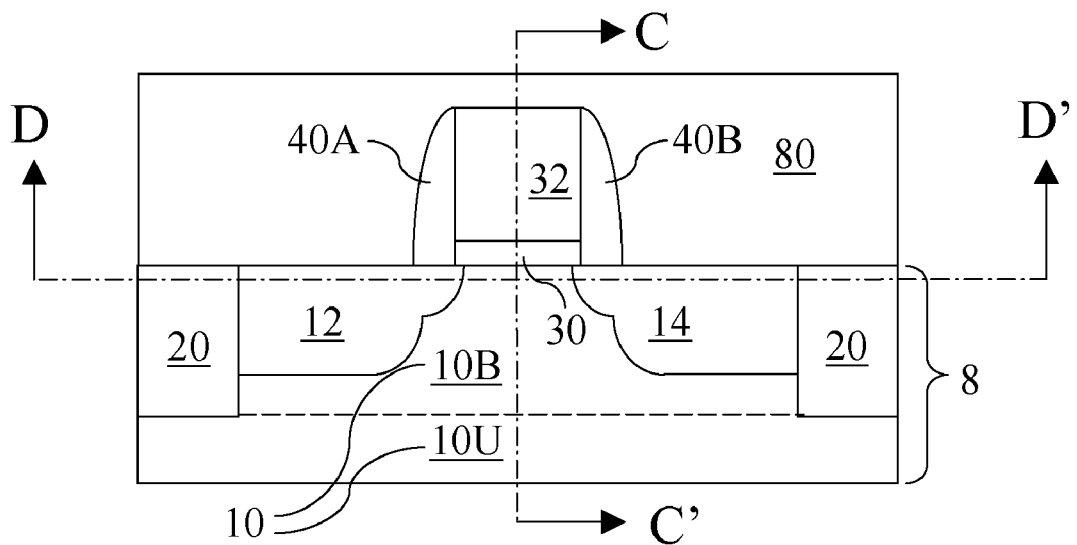
Figure 7C:
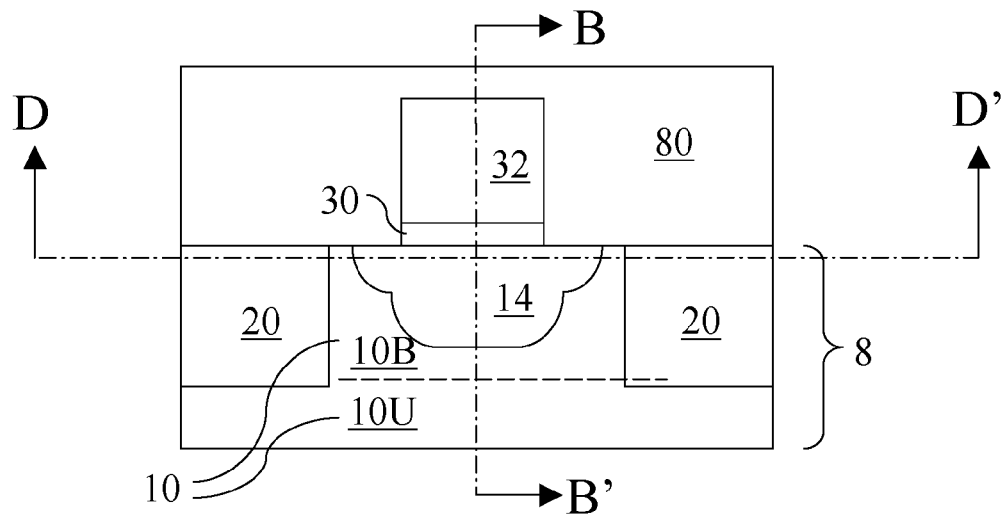
Figure 7D:
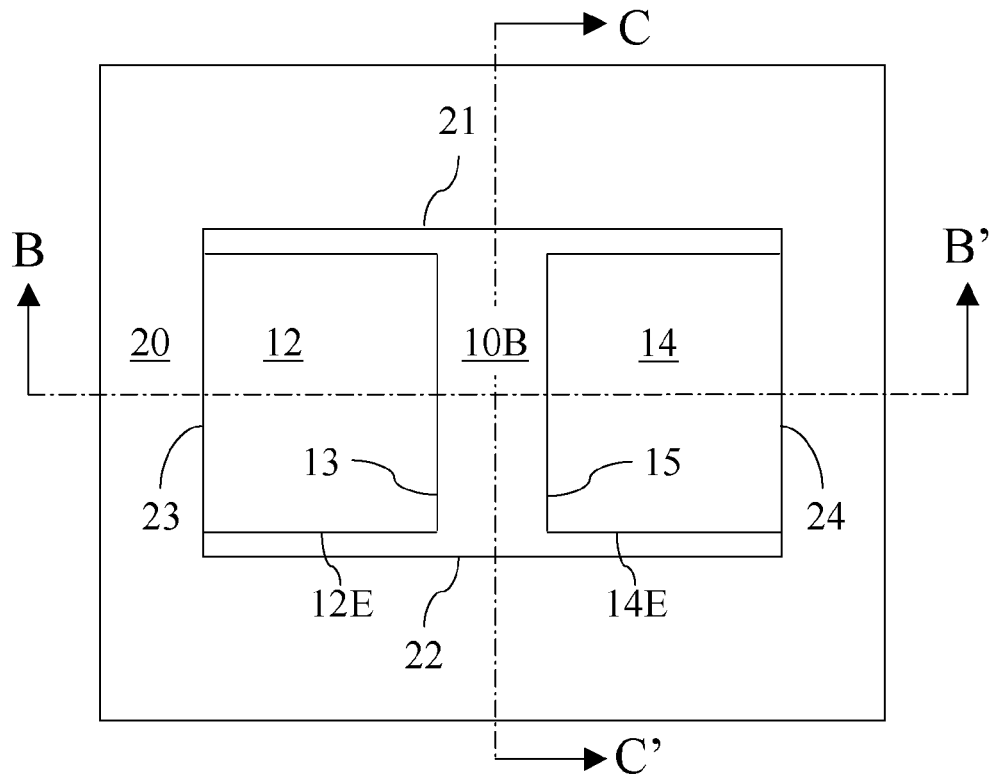

Referring to FIGS. 6A and 6B, the exposed portions of the gate electrode 32 and/or the gate spacer 40 are removed, for example, by an anisotropic etch, which may be a reactive ion etch. In case the gate electrode 32 comprises a different material than the semiconductor portion (10B, 12, 14), an etch that removes the gate electrode 32 selective to the semiconductor portion (10B, 12, 14) may be employed. For example, the gate electrode 32 may comprise germanium or a silicon germanium alloy that may be etched selective to silicon, which may be the material of the semiconductor portion (10B, 12, 14).

The gate electrode 32 is removed from above an entirety of the first lengthwise sidewall 21 and the second lengthwise sidewall 22. Portions of the shallow trench isolation structure 20 are exposed from beneath the removed portions of the gate electrode 32 during the anisotropic etch. Two sidewalls of the gate electrode 32 in the lengthwise direction are exposed by the anisotropic etch. Further, two sidewalls of the gate dielectric 32 may also be exposed by the anisotropic etch. Each of the two sidewalls of the gate electrode 32 overlies a portion of the body region 10B, a portion of the source region 12, a portion of the drain region 14, and is located inside an area of the semiconductor portion in the top-down view of FIG. 6A. The photoresist 37 is subsequently removed.

The remaining portions of the gate spacer 40 comprise two disjoined portions, which are herein referred to as a first gate spacer portion 40A and the second gate spacer portion 40B. The first gate spacer portion 40A laterally abuts the gate dielectric 30 and the gate electrode 32 and vertically abuts the source region 12. The second gate spacer portion 40B laterally abuts the gate dielectric 30 and the gate electrode 32 and vertically abuts the drain region 14. The first and second gate spacer portions (40A, 40B) are located within the area of the source region 12 or the drain region 14.

Referring to FIGS. 7A-7D, a dielectric material layer 80 is formed over the gate electrode 32, the first and second gate spacer portions (40A, 40B), the body region 10B, the source region 12, the drain region 14, and the shallow trench isolation structure. The gate dielectric material layer 80 is formed directly on the two sidewalls of the gate electrode 32, and if present, the two sidewalls of the gate dielectric 30. The dielectric material layer 80 may, or may not, include a mobile ion barrier layer (not shown), which typically comprises silicon nitride. The dielectric material layer 80 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Alternately, the dielectric material layer 80 may comprise a low-k dielectric material having a dielectric constant less than 3.9 (the dielectric constant of silicon oxide), and preferably less than about 2.5. Exemplary low-k dielectric materials include organosilicate glass (OSG) and SiLK™.

Typically, various contact via holes (not shown) are formed in the dielectric material layer 80 and filled with metal to from various contact vias (not shown). A first level metal wiring (not shown) is thereafter formed followed by farther formation of additional back-end-of-line (BEOL) structures (not shown).

Figure 8A:
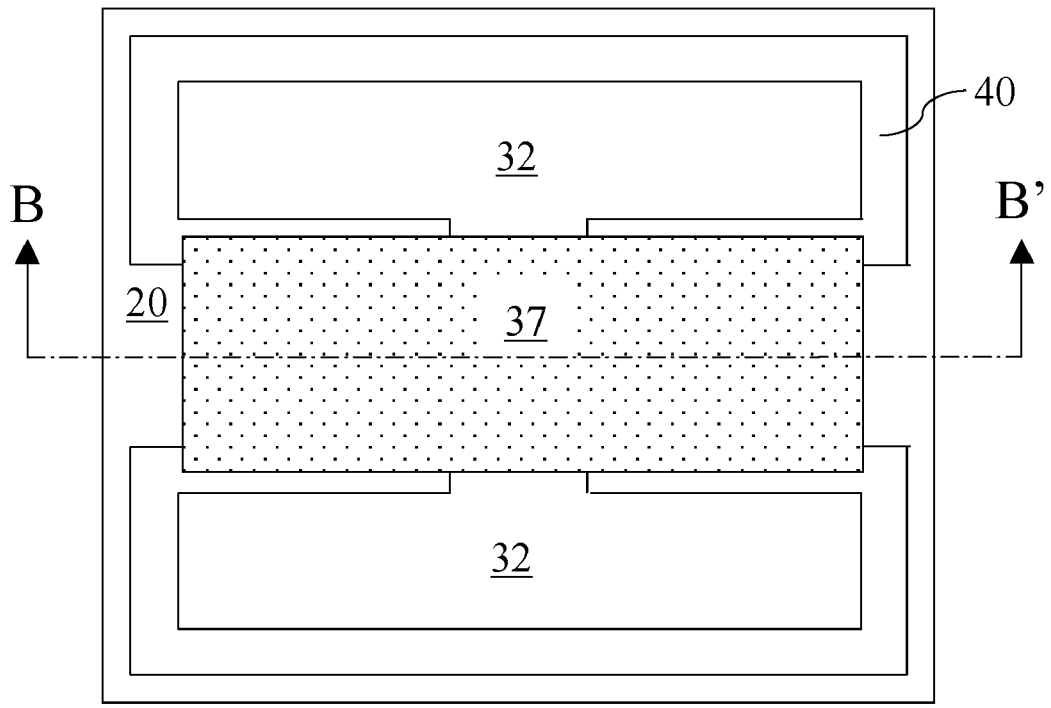
FIGS. 8A-9B are sequential views of a third exemplary semiconductor structure according to a third embodiment of the present invention. Figures with the suffix "A" are top-down views. Figures with the suffix "B" are vertical cross-sectional views along the plane B-B' of the corresponding figure with the same numeric label and the suffix "A." Figures with the same numeric label correspond to a same stage of a manufacturing process.
Figure 8B:
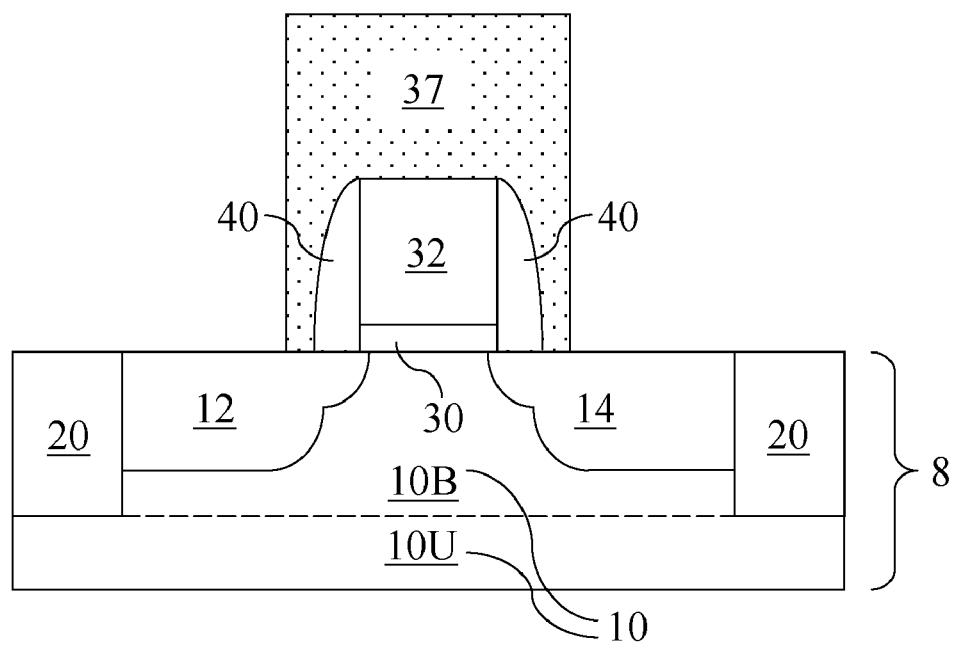

Referring to FIGS. 8A and 8B, a third exemplary semiconductor structure according to a third embodiment of the present invention is derived from the first exemplary semiconductor structure of FIGS. 4A-4D. A photoresist 37 is applied over the gate electrode 32, the gate spacer 40, the source region 12, and the drain region 14, and is lithographically patterned to cover the entirety of the surface of the source region 12, the entirety of the surface of the drain region 14, and a portion of the gate electrode 32 that corresponds to a center portion of the horizontal bar in the shape of the letter "H." The portions of the gate electrode 32 that correspond to the two vertical lines in the shape of the letter "H" are not covered by the photoresist 37. The edges of the photoresist fall on the portions of the gate spacer 40 that run along the lengthwise direction over the semiconductor portion (10B, 12, 14). Preferably, the edges of the photoresist 37 in the widthwise direction overlies the shallow trench isolation structure, and does not overlie the semiconductor portions (10B, 12, 14).

Figure 9A:
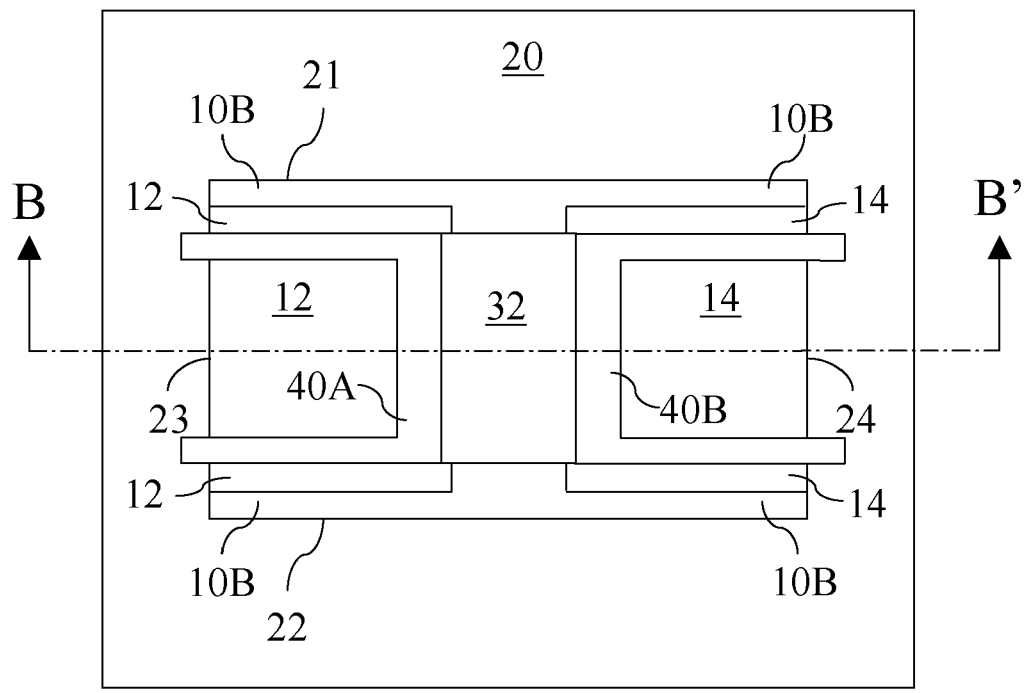
Figure 9B:
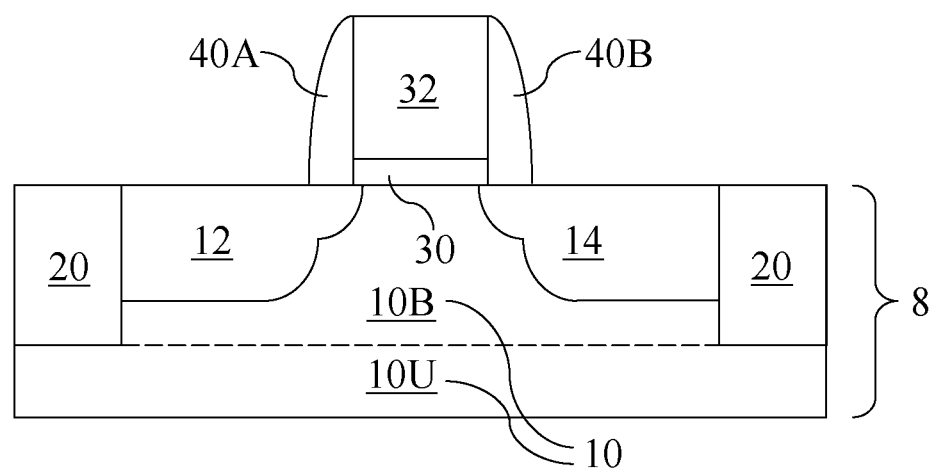

Referring to FIGS. 9A and 9B, the exposed portions of the gate electrode 32 and/or the gate spacer 40 are removed, for example, by an anisotropic etch, which may be a reactive ion etch. The gate electrode 32 may, or may not, comprise a different material from the semiconductor portion (10B, 12, 14) since areas of the semiconductor portion (10B, 12, 14) that include the current paths for a field effect transistor is protected by the photoresist 37, i.e., negligible amount of current flows through the portions of the semiconductor portion (10B, 12, 14) directly underneath the exposed surfaces that may have surface damages generated by the reactive ion etch.

As in the second embodiment, the gate electrode 32 is removed from above an entirety of the first lengthwise sidewall 21 and the second lengthwise sidewall 22. A portion of the shallow trench isolation structure 20, portions of the body region 10B, portions of the source region 12, and portions of the drain region 14 are exposed from beneath the removed portions of the gate electrode 32 during the anisotropic etch. Two sidewalls of the gate electrode 32 in the lengthwise direction are exposed by the anisotropic etch. Further, two sidewalls of the gate dielectric 32 may also be exposed by the anisotropic etch. Each of the two sidewalls of the gate electrode 32 overlies a portion of the body region 10B, a portion of the source region 12, a portion of the drain region 14, and is located inside an area of the semiconductor portion in the top-down view of FIG. 6A. The photoresist 37 is subsequently removed.

The remaining portions of the gate spacer 40 comprise two disjoined portions, which are herein referred to as a first gate spacer portion 40A and the second gate spacer portion 40B. The first gate spacer portion 40A laterally abuts the gate dielectric 30 and the gate electrode 32 and vertically abuts the source region 12. The second gate spacer portion 40B laterally abuts the gate dielectric 30 and the gate electrode 32 and vertically abuts the drain region 14. The first and second gate spacer portions (40A, 40B) extend outside the area of the source region 12 or the drain region 14 and into the area of overlying the shallow trench isolation portion 20. Each of the first and second gate spacer portions (40A, 40B) comprises a center portion abutting the gate electrode 32 and running in the widthwise direction and two prongs adjoined to an end of the center portion and running in the lengthwise direction. A dielectric material layer and various contact via holes may be formed as in the first and second embodiments.

Figure 10A:
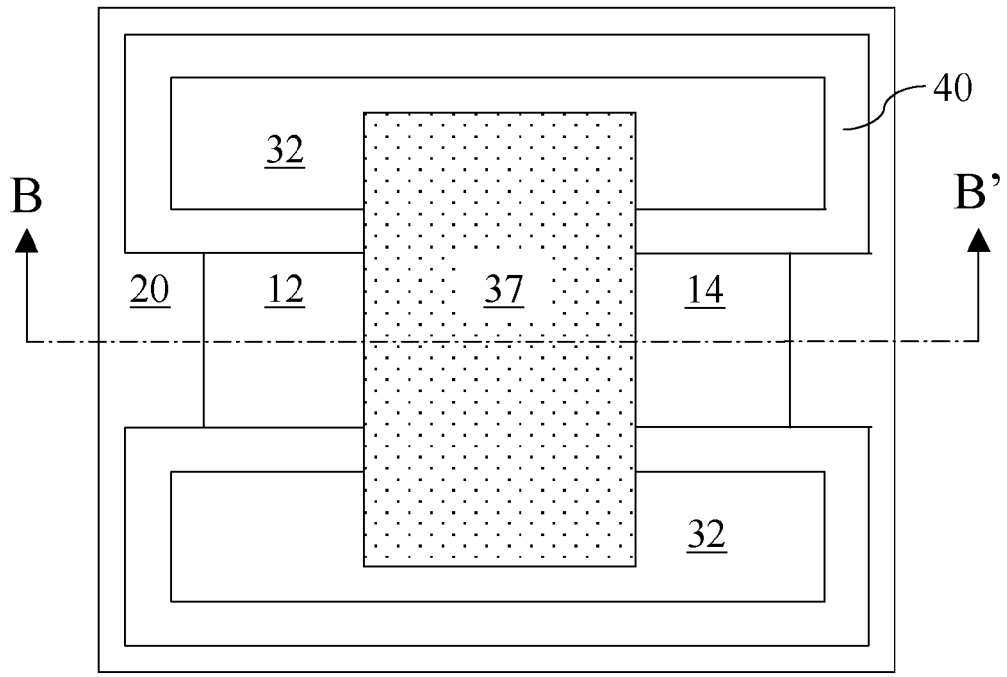
FIGS. 10A-11B are sequential views of a fourth exemplary semiconductor structure according to a fourth embodiment of the present invention. Figures with the suffix "A" are top-down views. Figures with the suffix "B" are vertical cross-sectional views along the plane B-B' of the corresponding figure with the same numeric label and the suffix "A." Figures with the same numeric label correspond to a same stage of a manufacturing process.
Figure 10B:
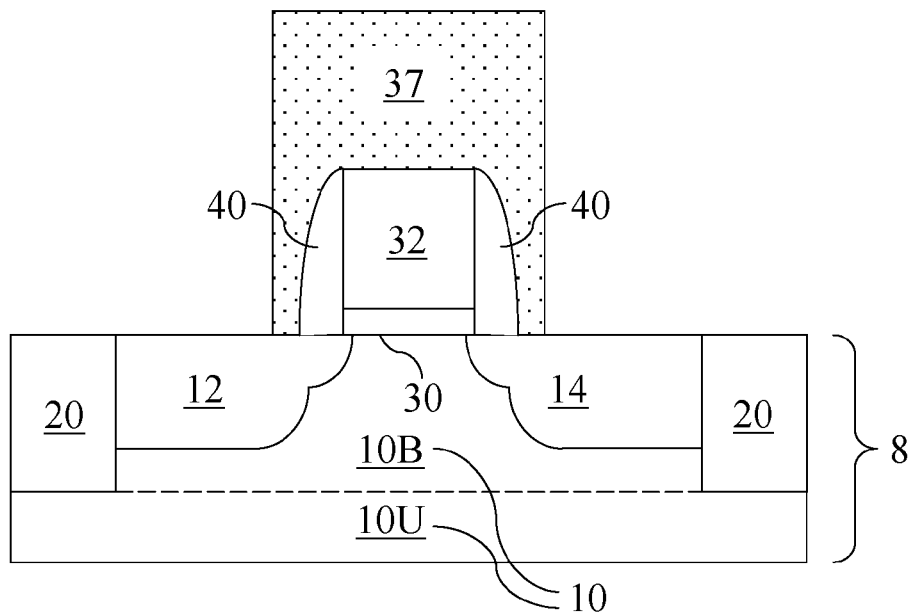

Referring to FIGS. 10A and 10B, a fourth exemplary semiconductor structure according to a fourth embodiment of the present invention is derived from the first exemplary semiconductor structure of FIGS. 4A-4D. A photoresist 37 is applied over the gate electrode 32, the gate spacer 40, the source region 12, and the drain region 14, and is lithographically patterned to cover the entirety of the surface of the source region 12, the entirety of the surface of the drain region 14, and a portion of the gate electrode 32 that corresponds to a center portion of the horizontal bar in the shape of the letter "H." The portions of the gate electrode 32 that correspond to the two vertical lines in the shape of the letter "H" are not covered by the photoresist 37. The edges of the photoresist fall on the portions of the gate spacer 40 that run along the lengthwise direction over the semiconductor portion (10B, 12, 14). Preferably, the edges of the photoresist 37 in the widthwise direction overlie the shallow trench isolation structure, and does not overlie the semiconductor portions (10B, 12, 14), i.e., are located outside the semiconductor portion (10B, 12, 14).

Figure 11A:
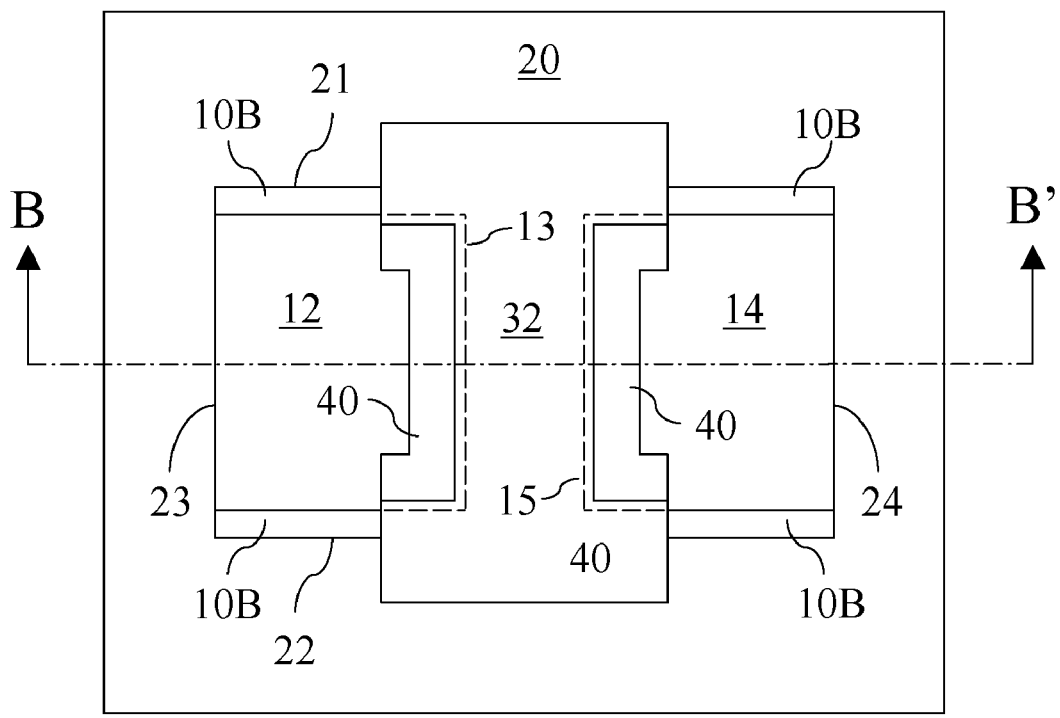
Figure 11B:
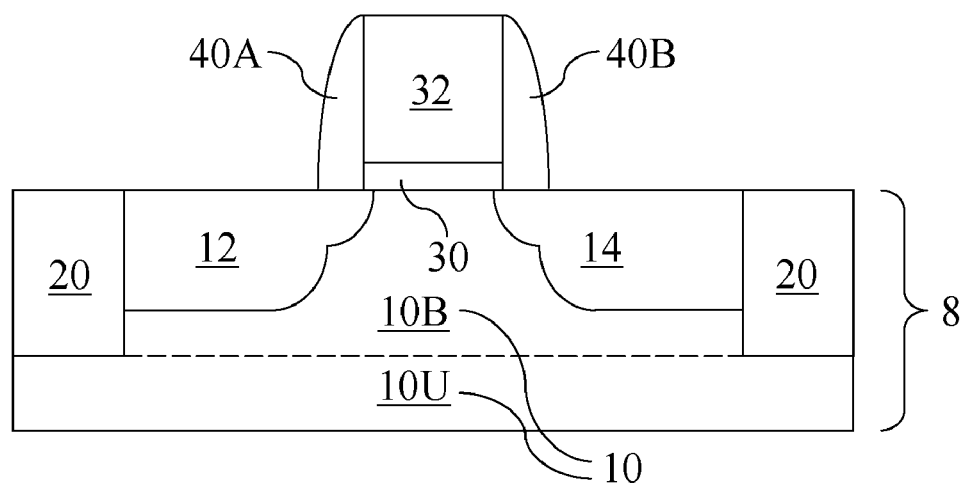
Figure 12A:
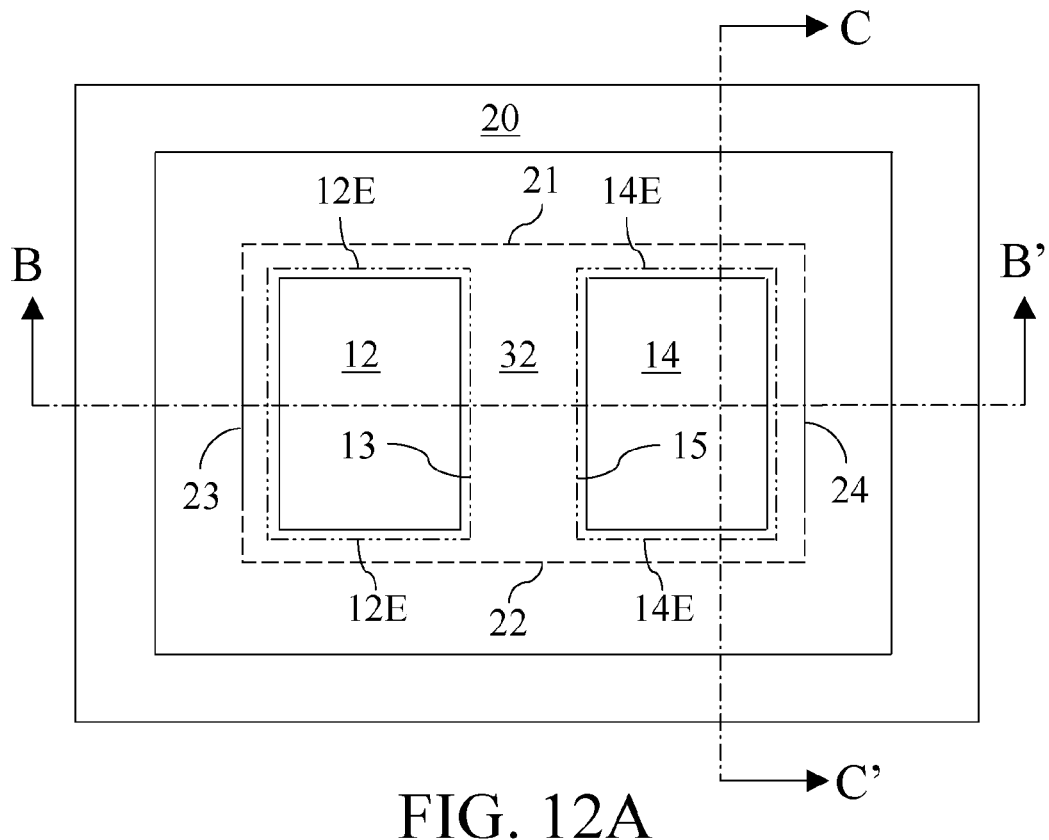
FIGS. 12A-13D are sequential views of a fifth exemplary semiconductor structure according to a fifth embodiment of the present invention. Figures with the suffix "A" are top-down views. Figures with the suffix "B" are vertical cross-sectional views along the plane B-B' of the corresponding figure with the same numeric label and the suffix "A." Figures with the suffix "D" are horizontal cross-sectional views along the plane D-D' of the corresponding figure with the same numeric label and the suffix "B" or "C." Figures with the same numeric label correspond to a same stage of a manufacturing process.
Figure 12B:
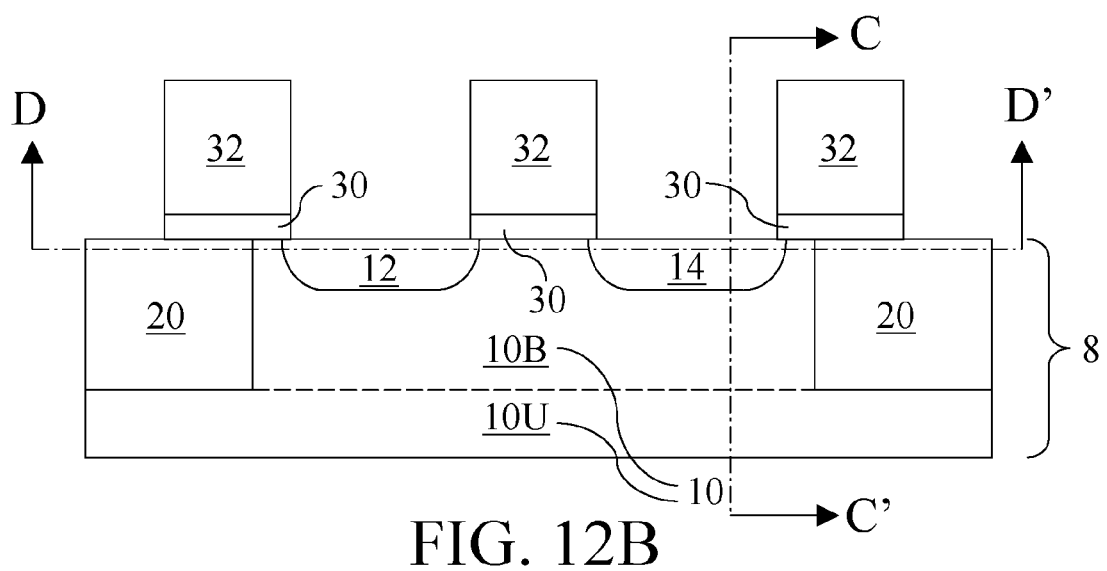
Figure 12C:
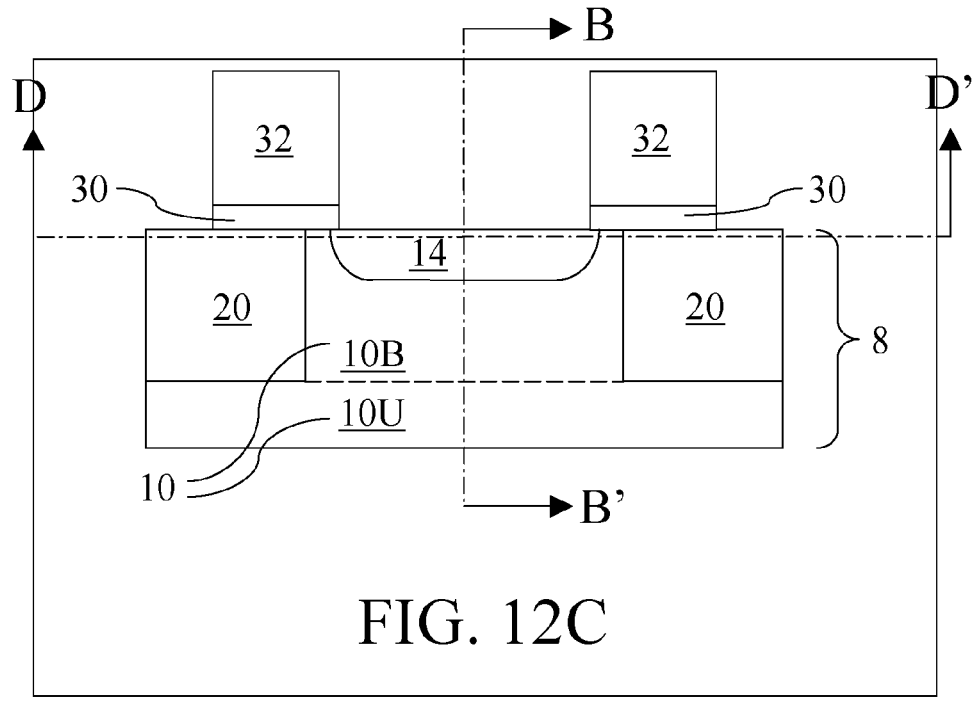
Figure 12D:
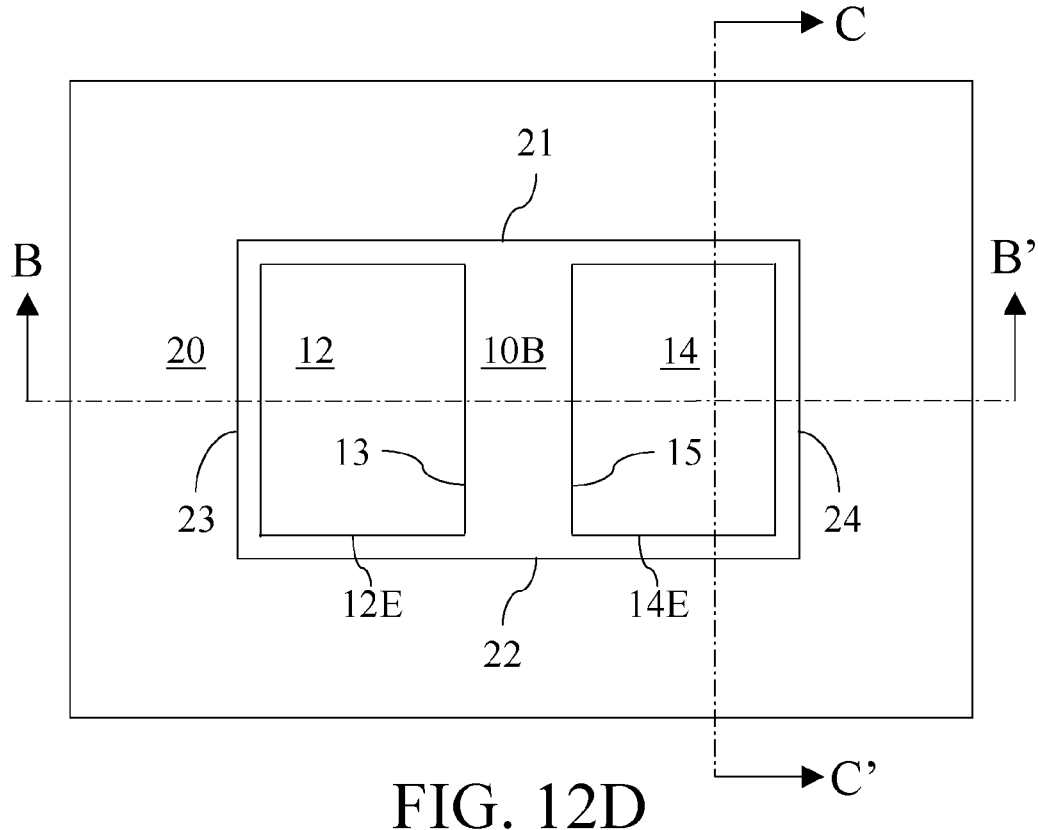

Referring to FIGS. 11A and 11B the exposed portions of the gate electrode 32 and/or the gate spacer 40 are removed, for example, by an anisotropic etch, which may be a reactive ion etch. Preferably, the gate electrode 32 is removed selective to the semiconductor portion (10B, 12, 14). In contrast with the second and third embodiment, the gate electrode 32 is removed from above a subset of the first lengthwise sidewall 21 which is less than the entirety of the first lengthwise sidewall 21, and from above a subset of the second lengthwise sidewall 22 which is less than the entirety of the second lengthwise sidewall 22. In other words, portions, not an entirety, of the gate electrode 32 are removed from above portions of the first lengthwise sidewall 21 and portions of the second lengthwise sidewall 22.

Specifically, the gate electrode 32 is removed from above end portions of the first and second lengthwise sidewalls (21, 22). A portion of the shallow trench isolation structure 20, portions of the body region 10B, a portion of the source region 12, and a portion of the drain region 14 are exposed from beneath the removed portions of the gate electrode 32 during the anisotropic etch. Two sidewalls of the gate electrode 32 in the lengthwise direction and four sidewalls of the gate electrode 32 in the widthwise direction are exposed by the anisotropic etch. Further, two sidewalls of the gate dielectric 32 and four sidewalls of the gate dielectric 30 in the widthwise direction may also be exposed by the anisotropic etch. Each of the two sidewalls of the gate electrode 32 in the lengthwise direction overlies a portion of the shallow trench isolation structure 20. Each of the four sidewalls of the gate electrode 20 in the widthwise direction overlies a portion of the shallow trench isolation structure 20, a portion of the body region 10B, and one of a portion of the source region 12 and a portion of the drain region 14. The photoresist 37 is subsequently removed.

The remaining portions of the gate spacer 40 comprise two disjoined portions, which are herein referred to as a first gate spacer portion 40A and the second gate spacer portion 40B. The first gate spacer portion 40A laterally abuts the gate dielectric 30 and the gate electrode 32 and vertically abuts the source region 12. The second gate spacer portion 40B laterally abuts the gate dielectric 30 and the gate electrode 32 and vertically abuts the drain region 14. The first and second gate spacer portions (40A, 40B) are located above the source region 12 or the drain region 14, respectively, and do not overlie the shallow trench isolation region 20. A dielectric material layer and various contact via holes may be formed as in the first and second embodiments.

Figure 2B:
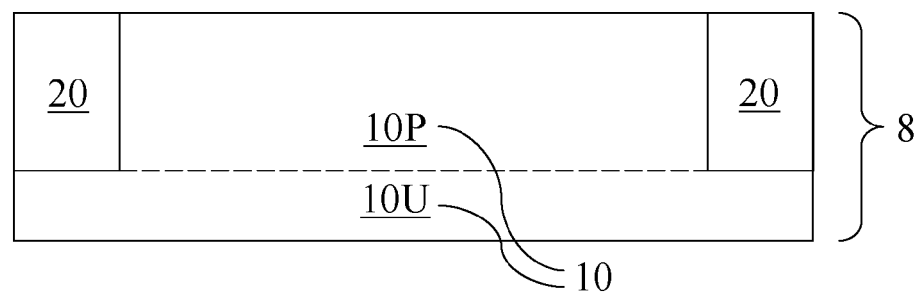

Referring to FIGS. 12A-12D, a fifth exemplary semiconductor structure according to a fifth embodiment of the present invention is derived from the first exemplary semiconductor structure of FIGS. 2A and 2B. A gate dielectric 30 and a gate electrode 32 are formed over the semiconductor substrate 8 employing the same processing steps as in the first embodiment. However, the shape of the gate electrode is patterned to cover all boundaries between the semiconductor portion 10P (See FIGS. 2A and 2B) and the shallow trench isolation structure 20.

Specifically, the stack of the gate dielectric layer and the gate electrode layer are lithographically patterned to form the gate dielectric 30 and the gate electrode 32 such that the stack of the gate dielectric 30 and the gate electrode 32 overlies the entirety of the first and second lengthwise sidewalls (21, 22) and the entirety of the first and second widthwise sidewalls (23, 24). Thus, the gate electrode 32 straddles the semiconductor portion 10P and the shallow trench isolation structure 20 around the entirety of the boundary between the semiconductor portion 10 and the shallow trench isolation structure.

The pattern in the gate dielectric 30 and the gate electrode 32 comprises two openings separated by a constant distance therebetween. The area of the two openings defines a source region and a drain region by subsequent ion implantation. The distance between the two openings defines the gate length of a transistor to be formed.

Dopants of the second conductivity type are implanted into the semiconductor portion 10P within the area of the two openings employing the gate electrode 32 as an implantation mask. An implanted region in the semiconductor portion 10P within one of the two openings constitutes a source region 12, while another implanted region in the semiconductor portion 10P within the other of the two openings constitutes a drain region 14. The dopant concentration of the source region 12 and the drain region 14 may be from about $1.0 \times 10^{19}/cm^3$ to about $1.0 \times 10^{21}/cm^3$, and preferably from about $1.0 \times 10^{20}/cm^3$ to about $5.0 \times 10^{20}/cm^3$, although lesser and greater dopant concentrations are explicitly contemplated herein. The remaining unimplanted region of the semiconductor portion 10P constitutes a body region 10B having a doping of the first conductivity type. Thus, the semiconductor portion 10P comprises the source region 12, the drain region 14, and the body region 10B. The body region 10B and the underlying semiconductor layer 10U collectively constitute the semiconductor layer 10, which may have the same composition and epitaxially aligned.

The source region 12 and the drain region 14, which have a doping of the second conductivity type, are disjoined from the shallow trench isolation structure 20 by the body region 10B, which has a doping of the first conductivity. Neither the source region 12 nor the drain region 14 contacts the shallow trench isolation structure 20, and consequently, the source region 12 and the drain region 14 are free from the effects of the interfacial defects between the shallow trench isolation structure 20 and any semiconductor material, i.e., the body region 10B and the underlying semiconductor layer 10U. Thus, all edges of the source region 12 and the drain region 14, which include the lengthwise source region edges 12E and the lengthwise drain region edges 14E, are formed within the semiconductor portion (10B, 12, 14). The shape of the gate electrode 32 is configured to insure that lateral straggle and diffusion of the second conductivity type dopants implanted to form the source region 12 and the drain region 14 are not placed in proximity to the first and second lengthwise sidewalls (21, 22) in any significant quantity so that that the body region 10B having a doping of the first conductivity type laterally abuts the shallow trench isolation structure 20 at the first and second lengthwise sidewalls (21, 22) and at the first and second widthwise sidewalls (23, 24).

Referring to FIGS. 13A-13D, two inner gate spacers 40I and an outer gate spacer 40O are formed directly on the sidewalls of the gate electrode 32 and the sidewalls of the gate dielectric 30 employing the same processing steps as in the first embodiment. For example, the inner gate spacers 40I and the outer gate spacer 40O may be formed by a substantially conformal deposition of a dielectric layer, followed by an anisotropic ion etch that removes horizontal portions of the dielectric layer so that the remaining portions of the dielectric layer on substantially vertical sidewalls of the gate electrode 32 and the substantially vertical sidewalls of the gate dielectric 30. Each of the two inner gate spacers 40I is formed within one of the two openings in the gate electrode 32. The outer gate spacer 40O is formed on the outer sidewalls of the gate electrode 32 as a single contiguous piece that laterally encloses the gate electrode 32.

Typically, more dopants of the second conductivity type are implanted into the semiconductor portion (10B, 12, 14) employing the gate spacer 40 as an implantation mask. Typically, the energy of the second conductivity dopants at this step is set such that the depth of implantation is greater than the depth of implantation of the second conductivity dopants in the previous implantation step corresponding to FIGS. 12A-12D. Thus, the source region 12 and the drain region 14 expand downward to include the newly implanted regions within the semiconductor portion (10B, 12, 14), while the body region 10B shrinks in volume accordingly. The portion of the source region 12 having the increased depth is termed a deep source region in the art, and the portion of the drain region 14 having the increased depth is termed a deep drain region in the art.

Figure 13A:
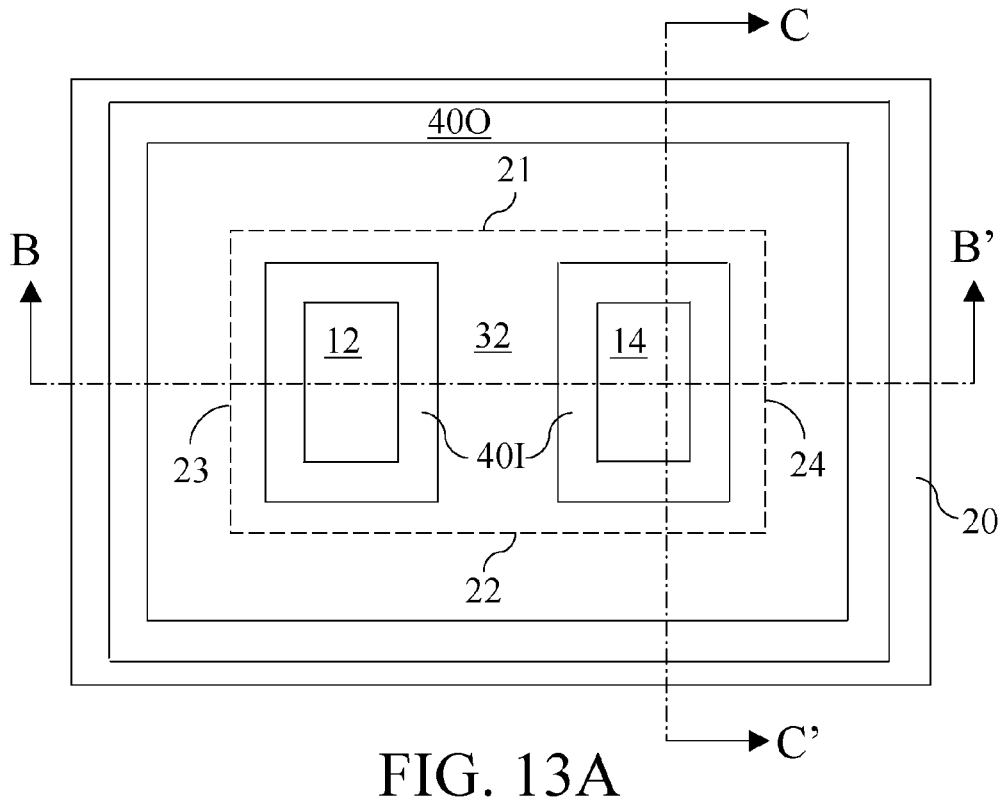

The first and second lengthwise sidewalls (21, 22) and the masked portions of the first and second widthwise sidewalls (23, 24), while not visible in a true top-down view at this step, are marked by broken lines in the top-down view of FIG. 13A.

The inner gate spacers 40I and the outer gate spacer 40O do not cross over the first or second lengthwise sidewalls (21, 22) or the first or second widthwise sidewalls (23, 24). Each of the inner gate spacers 40I is confined within an area surrounded by the first and second lengthwise sidewalls (21, 22) and the first and second widthwise sidewalls (23, 24). The outer gate spacer 40O is located outside the area bounded by the first and second lengthwise sidewalls (21, 22) and the first and second widthwise sidewalls (23, 24). Since the ion implantation does not extend the lateral area of the source region 12 or the drain region 14, but extends the source region 12 and the drain region 14 only vertically, the source region 12 and the drain region are separated from the shallow trench isolation structure 20 by the body region 10B.

A dielectric material layer (not shown) may be deposited over the gate electrode 32, the gate spacer 40, the source region 12, the drain region 14, and the shallow trench isolation structure. Various contact via holes (not shown) are formed in the dielectric material layer and filled with metal to from various contact vias (not shown). A first level metal wiring (not shown) is thereafter formed followed by further formation of additional back-end-of-line (BEOL) structures (not shown).

Figure 13B:
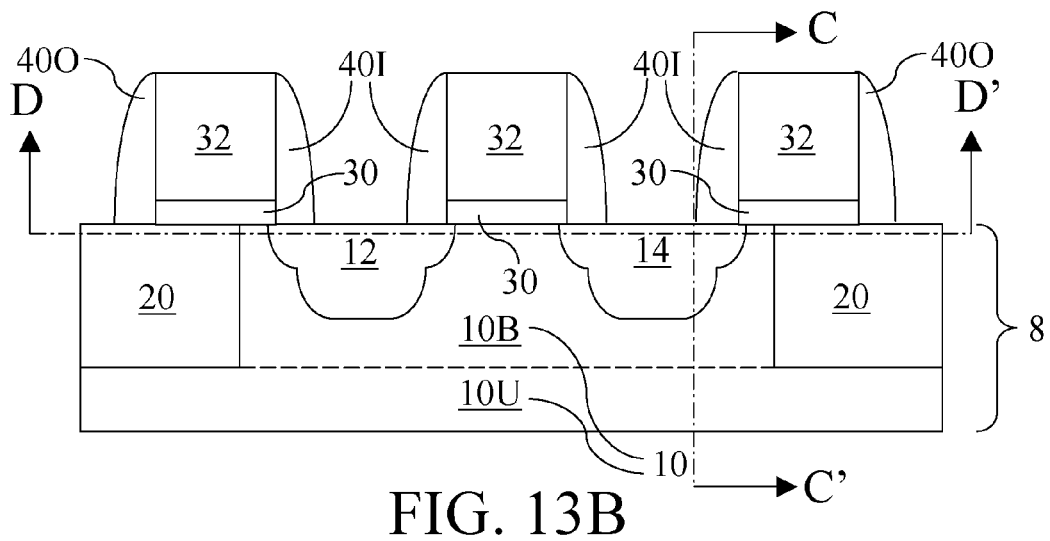
Figure 13C:
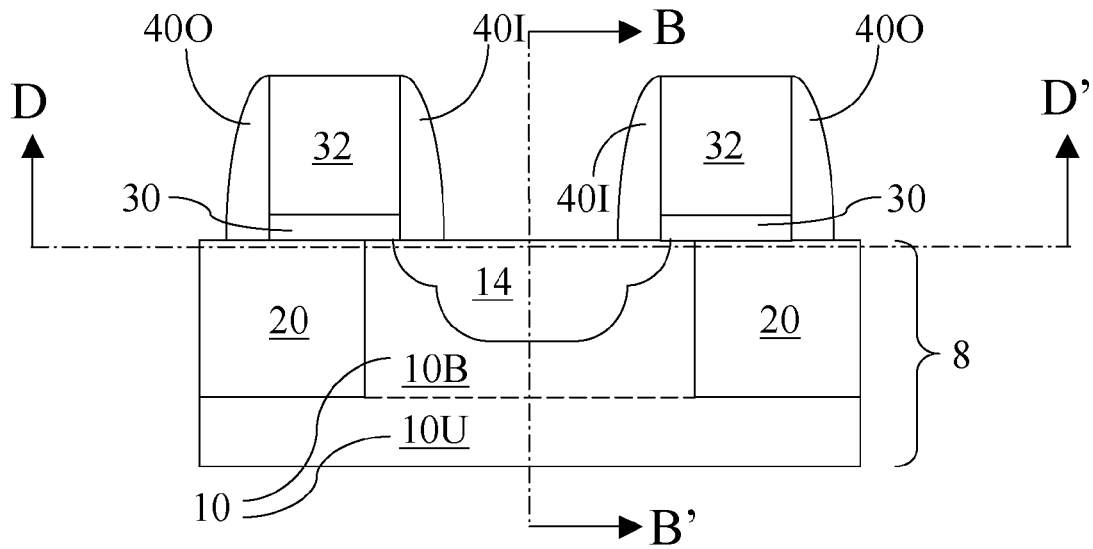
Figure 13D:
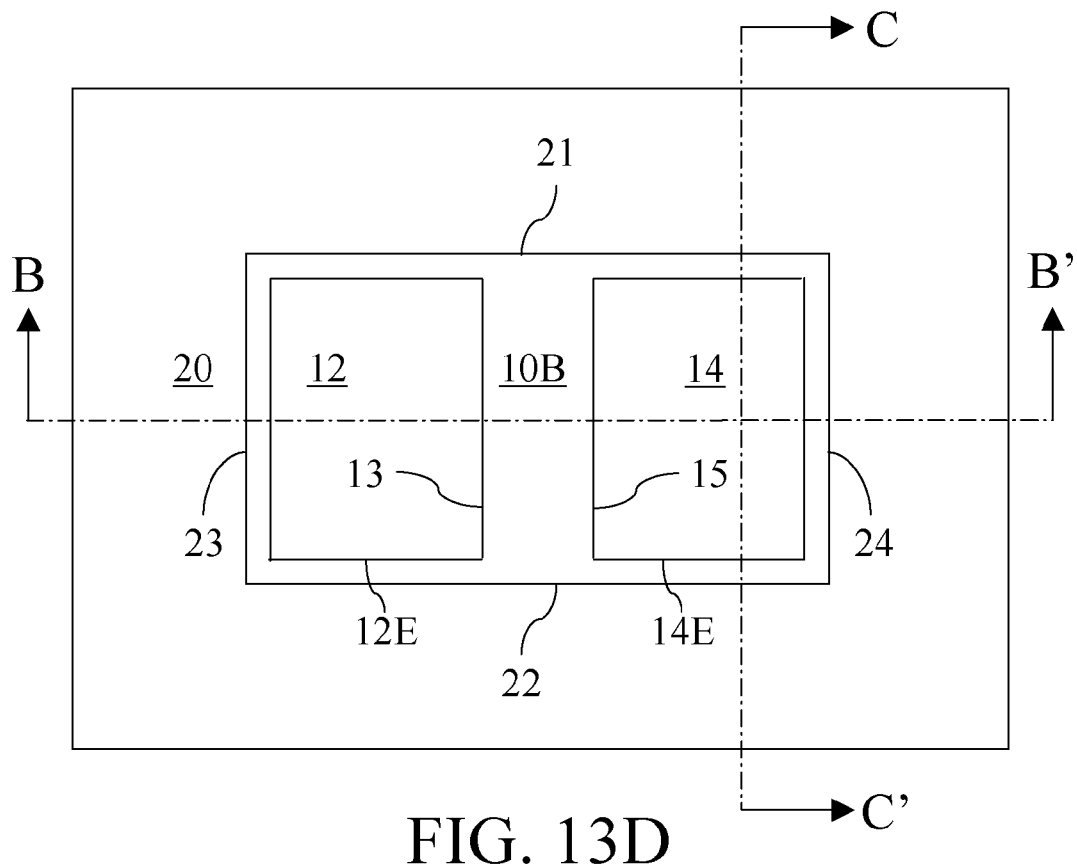
Figure 14A:
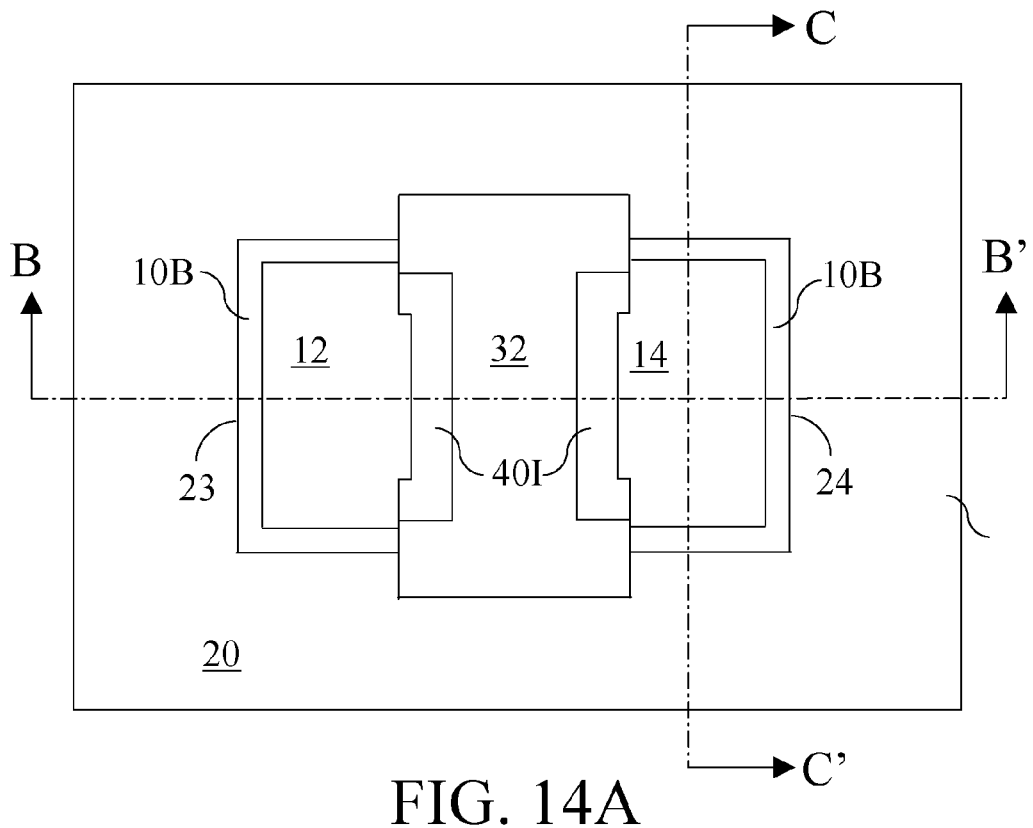
FIGS. 14A-14D are views of a sixth exemplary semiconductor structure according to a fifth embodiment of the present invention.
Figure 14B:
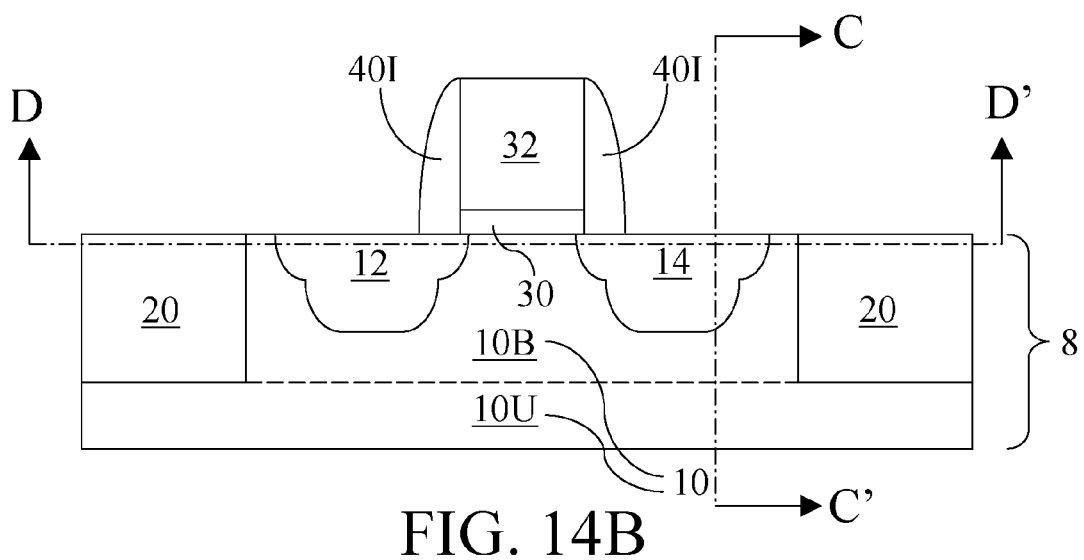
Figure 14C:
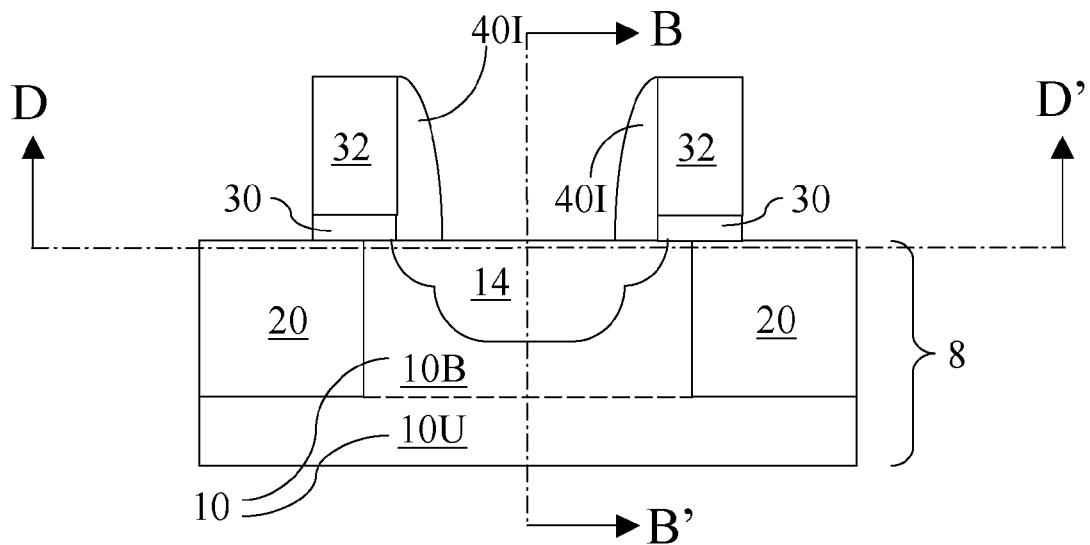
Figure 14D:
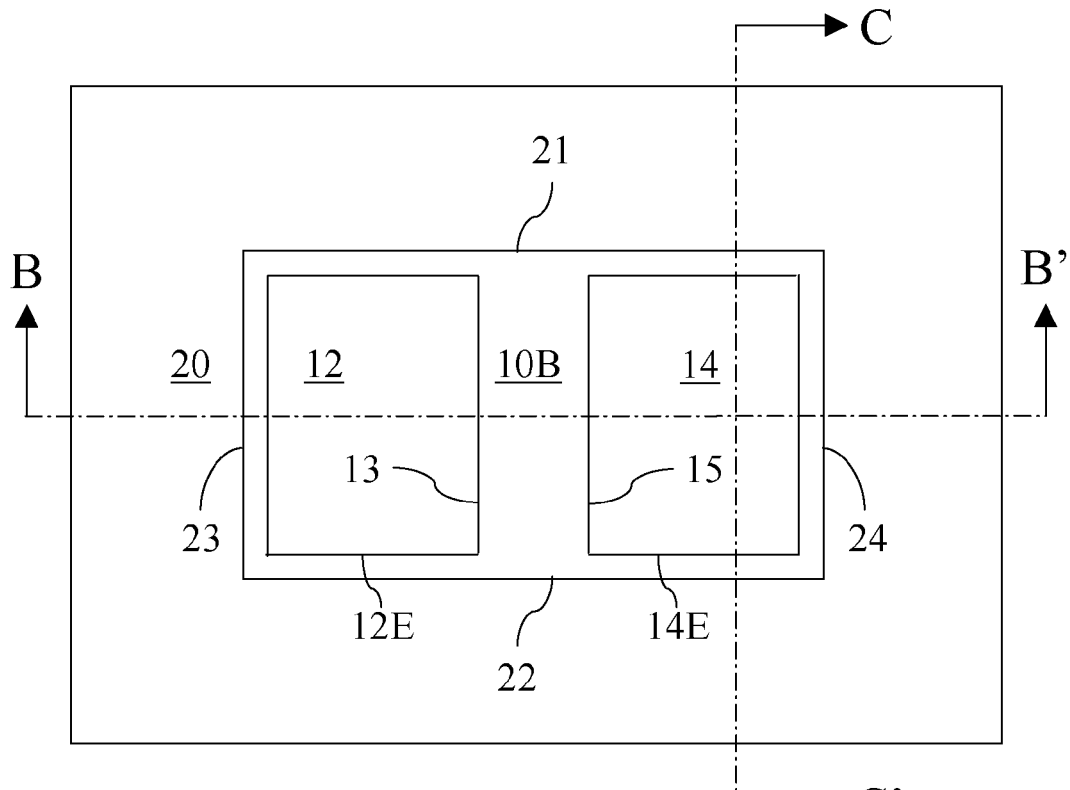

Referring to FIGS. 14A-14B, a sixth exemplary semiconductor structure according to a sixth embodiment of the present invention is derived from the fifth exemplary semiconductor structure of FIGS. 13A-13B by patterning the gate electrode 32, the inner gate spacers 40I, and the outer gate spacer 30O. Any of the patterning methods employed in the second through fourth embodiments of the present invention may be employed. While the method of patterning employed in the fourth embodiment is illustrated for the purposes of description of the sixth embodiment, use of other patterning methods in second or third embodiment in the sixth embodiment is explicitly contemplated herein.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a semiconductor portion located in a semiconductor substrate, said semiconductor portion having a first lengthwise sidewall, a second lengthwise sidewall, a first widthwise sidewall, and a second widthwise sidewall, and including a body region, a source region abutting said body region, and a drain region abutting said body region and disjoined from said source region, wherein said body region has a same composition throughout;
a gate dielectric in direct contact with an upper surface of said body region;
a shallow trench isolation structure located in said semiconductor substrate and laterally surrounding and abutting said semiconductor portion, wherein said source region laterally abuts said first widthwise sidewall, said drain region laterally abuts said second widthwise sidewall, and said source region and said drain region are separated from said first and second sidewalls by said body region, and wherein said body region is in direct contact with sidewalls of said shallow trench isolation structure; and
a gate electrode overlying an edge of said source region and an edge of said drain region, wherein an underlying semiconductor layer is located directly beneath said body region and a bottom surface of said shallow trench isolation structure, said entirety of said body region and said underlying semiconductor layer have said same composition throughout and are epitaxially aligned to each other.

2. The semiconductor structure of claim 1, wherein said gate electrode has a shape of a letter "H," wherein two vertical lines of said letter "H" correspond to portions of said gate electrode that overlie said first lengthwise sidewall and said second lengthwise sidewall, respectively.

3. The semiconductor structure of claim 1, wherein said first widthwise sidewall is the only area at which said source region abuts said shallow trench isolation structure, and wherein said second widthwise sidewall is the only area at which said drain region abuts said shallow trench isolation structure.

4. The semiconductor structure of claim 1, wherein each of said first and second lengthwise sidewalls is directly adjoined to said first widthwise sidewall and said second widthwise sidewall.

5. The semiconductor structure of claim 1, wherein said body region has a doping of a first conductivity type and said source region and said drain region has a doping of a second conductivity type, wherein said second conductivity type is the opposite of said first conductivity type.

6. The semiconductor structure of claim 1, further comprising:
a gate dielectric vertically abutting a portion of said body region, a portion of said source region, a portion of said drain region, and said gate electrode; and
a gate spacer laterally abutting and laterally enclosing said gate dielectric and said gate electrode.

7. The semiconductor structure of claim 1, further comprising:
a gate dielectric vertically abutting a portion of said body region, a portion of said source region, a portion of said drain region, and said gate electrode;
a first gate spacer portion laterally abutting said gate dielectric and said gate electrode and vertically abutting said source region; and
a second gate spacer portion laterally abutting said gate dielectric and said gate electrode, vertically abutting said drain region, and disjoined from said first gate spacer.

8. A semiconductor structure comprising:
a semiconductor portion located in a semiconductor substrate and including a body region, a source region abutting said body region, and a drain region abutting said body region and disjoined from said source region, wherein said body region has a same composition throughout;
a gate dielectric in direct contact with an upper surface of said body region;
a shallow trench isolation structure located in said semiconductor substrate and laterally surrounding and abutting said semiconductor portion, wherein said source region and said drain region are separated from said shallow trench isolation structure by said body region, and wherein said body region is in direct contact with sidewalls of said shallow trench isolation structure; and
a gate electrode overlying an edge of said source region and an edge of said drain region, wherein an underlying semiconductor layer is located directly beneath said body region and a bottom surface of said shallow trench isolation structure, said entirety of said body region and said underlying semiconductor layer have said same composition throughout and are epitaxially aligned to each other.

9. The semiconductor structure of claim 8, wherein said body region has a doping of a first conductivity type and said source region and said drain region have a doping of a second conductivity type which is an opposite conductivity type of said first conductivity type.

10. The semiconductor structure of claim 8, further comprising:
a gate dielectric vertically abutting a portion of said body region, a portion of said source region, a portion of said drain region, and said gate electrode;
a first gate spacer portion laterally abutting said gate dielectric and said gate electrode and vertically abutting said source region; and
a second gate spacer portion laterally abutting said gate dielectric and said gate electrode, vertically abutting said drain region, and disjoined from said first gate spacer.

11. A method of forming a semiconductor structure comprising:
providing a semiconductor portion having a first lengthwise sidewall, a second lengthwise sidewall, a first widthwise sidewall, and a second widthwise sidewall in a semiconductor substrate, wherein each of said first and second lengthwise sidewalls is directly adjoined to said first widthwise sidewall and said second widthwise sidewall;
forming a gate dielectric directly on an upper surface of a middle portion of said semiconductor portion;
forming a gate electrode on said gate dielectric, wherein said gate electrode overlies said first and second widthwise sidewalls and said middle portion of said semiconductor portion, wherein said middle portion is located between said first and second widthwise sidewalls; and
forming a source region and a drain region within said semiconductor portion, wherein said source region is formed on one side of said middle portion and said drain region is formed on another side of said middle portion, and wherein each of said source region and said drain region is disjoined from said first and second lengthwise sidewalls, wherein an entirety of said middle portion has a same composition, and wherein said middle portion is in direct contact with sidewalls of said shallow trench isolation structure after said forming of said source region and said drain region, and said middle portion is an unimplanted semiconductor region in said semiconductor substrate, and said semiconductor substrate further comprises an underlying semiconductor layer located directly beneath said middle portion and a bottom surface of a shallow trench isolation structure, wherein said entirety of said middle portion and said underlying semiconductor layer have said same composition throughout and are epitaxially aligned to each other after formation of said source region and said drain region.

12. The method of claim 11, wherein said semiconductor portion has a doping of a first conductivity type, and wherein said method further comprises implanting dopants of a second conductivity type, which is the opposite of said first conductivity type, into said semiconductor portion employing said gate electrode as an implantation mask to form said source region and said drain region.

13. The method of claim 11, further comprising forming a gate spacer directly on said gate electrode, wherein said gate spacer laterally encloses said gate electrode.

14. The method of claim 13, further comprising implanting more dopants of said second conductivity type into said semiconductor portion employing said gate spacer as an implantation mask.

15. The method of claim 13, further comprising removing a portion of said gate electrode from above a portion of said first lengthwise sidewall and a portion of said second lengthwise sidewall and thereby exposing a portion of said shallow trench isolation structure.

16. The method of claim 15, wherein said gate electrode is removed from above an entirety of said first lengthwise sidewall and said second lengthwise sidewall.

17. The method of claim 15, further comprising:
exposing two sidewalls of said gate electrode and two sidewalls of said gate dielectric during said removing of said portion of said gate dielectric; and
forming a dielectric material layer directly on said two sidewalls of said gate electrode and said two sidewalls of said gate dielectric.

* * * * *